(12) United States Patent
Inubushi et al.

(10) Patent No.: US 11,944,018 B2
(45) Date of Patent: Mar. 26, 2024

(54) MAGNETORESISTANCE EFFECT ELEMENT

(71) Applicant: TDK CORPORATION, Tokyo (JP)

(72) Inventors: Kazuumi Inubushi, Tokyo (JP); Katsuyuki Nakada, Tokyo (JP); Shinto Ichikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 138 days.

(21) Appl. No.: 17/858,200

(22) Filed: Jul. 6, 2022

(65) Prior Publication Data

US 2023/0025589 A1    Jan. 26, 2023

(30) Foreign Application Priority Data

Jul. 15, 2021    (JP) ................................ 2021-116965

(51) Int. Cl.
| | |
|---|---|
| *G11C 11/00* | (2006.01) |
| *H10N 50/10* | (2023.01) |
| *H10N 50/85* | (2023.01) |
| *G11B 5/37* | (2006.01) |
| *G11C 11/16* | (2006.01) |

(52) U.S. Cl.
CPC ............. *H10N 50/85* (2023.02); *H10N 50/10* (2023.02); *G11B 5/372* (2013.01); *G11C 11/161* (2013.01)

(58) Field of Classification Search
CPC ..... G11B 5/372; G11C 11/161; H03B 15/006; H10N 50/10; H10N 50/85
USPC .......................................................... 365/158
See application file for complete search history.

(56) References Cited

U.S. PATENT DOCUMENTS

| | | | | |
|---|---|---|---|---|
| 2007/0268632 | A1* | 11/2007 | Jogo | ..................... B82Y 25/00 |
| | | | | 360/324.12 |
| 2016/0019917 | A1 | 1/2016 | Du et al. | |
| 2016/0314827 | A1* | 10/2016 | Cros | ..................... G11C 11/16 |
| 2017/0221507 | A1* | 8/2017 | Furubayashi | ........ G11B 5/1278 |

(Continued)

FOREIGN PATENT DOCUMENTS

| | | |
|---|---|---|
| JP | 2012-190914 A | 10/2012 |
| JP | 6137577 B2 | 5/2017 |
| JP | 2017-103419 A | 6/2017 |

OTHER PUBLICATIONS

Young-suk Choi et al. "Enhancement of Current-Perpendicular-To-Plane Giant Magnetoresistance by Insertion of Amorphous Ferromagnetic Underlayer in Heusler Alloy-Based Spin-Valve Structures". Applied Physics Express, 2017, vol. 10, pp. 013006-1-013006-4.

(Continued)

*Primary Examiner* — Ly D Pham
(74) *Attorney, Agent, or Firm* — Oliff PLC

(57) ABSTRACT

A magnetoresistance effect element of the present disclosure includes a first Ru alloy layer, a first ferromagnetic layer, a non-magnetic metal layer, and a second ferromagnetic layer in order, wherein the first Ru alloy layer contains one or more Ru alloys represented by the following general formula (1), $$Ru_\alpha X_{1-\alpha} \qquad (1)$$

where, in the general formula (1), the symbol X represents one or more elements selected from the group consisting of Be, B, Ti, Y, Zr, Nb, Mo, Rh, In, Sn, La, Ce, Nd, Sm, Gd, Dy, Er, Ta, W, Re, Os, and Ir, and the symbol $\alpha$ represents a number satisfying $0.5<\alpha<1$, the first ferromagnetic layer contains a Heusler alloy, and the second ferromagnetic layer contains a Heusler alloy.

13 Claims, 9 Drawing Sheets

(56) References Cited

U.S. PATENT DOCUMENTS

2017/0229643 A1    8/2017  Chen et al.
2017/0256351 A1*   9/2017  Cros ..................... H10N 50/00

OTHER PUBLICATIONS

Hari S. Goripati et al. "Bi-Quadratic Interlayer Exchange Coupling in Co2MnSi/Ag/Co2MnSi Pseudo Spin-Valve". Journal of Applied Physics, 2011, vol. 110, pp. 123914-1-123914-7.

T. Furubayashi et al. "Structure and Transport Properties of Current-Perpendicular-To-Plane Spin Valves Using Co2FeAl0.5Si0.5 and Co2MnSi Heusler Alloy Electrodes". Journal of Applied Physics, 2010, vol. 107, pp. 113917-1-113917-7.

\* cited by examiner

MAGNETORESISTANCE EFFECT ELEMENT

BACKGROUND OF THE INVENTION

Field of the Invention

The present disclosure relates to a magnetoresistance effect element.

Priority is claimed on Japanese Patent Application No. 2021-116965, filed Jul. 15, 2021, the content of which is incorporated herein by reference.

Description of Related Art

A magnetoresistance effect element is an element whose resistance value in a laminating direction changes due to a magnetoresistance effect. A magnetoresistance effect element includes two ferromagnetic layers and a non-magnetic metal layer sandwiched between them. A magnetoresistance effect element in which a conductor is used for a non-magnetic metal layer is called a giant magnetoresistance (GMR) element, and a magnetoresistance effect element in which an insulating layer (a tunnel barrier layer or a barrier layer) is used for a non-magnetic metal layer is called a tunnel magnetoresistance (TMR) element. A magnetoresistance effect element can be applied in various applications such as magnetic sensors, high frequency components, magnetic heads, and non-volatile random access memories (MRAMs).

Non-Patent Document 1 discloses a magnetoresistance effect element having a configuration in which a Ru layer, an amorphous CoFeBTa layer, and a CoMnFeGe layer are laminated in order. According to Non-Patent Document 1, this magnetoresistance effect element can be manufactured at a relatively low temperature.

Non-Patent Documents

[Non-Patent Document 1] Young-suk Choi et al, Applied Physics Express, 10, 013006 (2017)

SUMMARY OF THE INVENTION

In the magnetoresistance effect element of Non-Patent Document 1, a Heusler CoMnFeGe film is formed on an amorphous CoFeBTa layer. However, in the amorphous CoFeBTa layer, a large amount of atomic mutual diffusion with the Heusler alloy occurs. For this reason, it is difficult to sufficiently improve the magnetoresistance effect.

The present disclosure has been made in view of the above problems, and an object thereof is to provide a magnetoresistance effect element that can be manufactured at a relatively low temperature and has a large MR ratio (magnetoresistance ratio).

The present inventors have found that a magnetoresistance effect element, in which a first ferromagnetic layer, a non-magnetic metal layer, and a second ferromagnetic layer are laminated in order on a Ru alloy layer containing a specific Ru alloy, can be manufactured at a relatively low temperature, is less likely to cause atomic mutual diffusion between layers thereof, and has an increased magnetoresistance effect. Accordingly, the present disclosure provides the following means for solving the above problems.

[1] A magnetoresistance effect element including a first Ru alloy layer, a first ferromagnetic layer, a non-magnetic metal layer, and a second ferromagnetic layer in order, wherein the first Ru alloy layer contains one or more Ru alloys represented by the following general formula (1), $$Ru_\alpha X_{1-\alpha} \quad (1)$$

where, in the general formula (1), the symbol X represents one or more elements selected from the group consisting of Be, B, Ti, Y, Zr, Nb, Mo, Rh, In, Sn, La, Ce, Nd, Sm, Gd, Dy, Er, Ta, W, Re, Os, and Ir, and the symbol α represents a number satisfying $0.5<\alpha<1$, the first ferromagnetic layer contains a Heusler alloy, and the second ferromagnetic layer contains a Heusler alloy.

[2] The magnetoresistance effect element according to the above aspect may be configured such that the symbol X in the general formula (1) represents one or more elements selected from the group consisting of B, Ti, Zr, Nb, Mo, Rh, Ta, W, Re, Os, and Ir.

[3] The magnetoresistance effect element according to the above aspect may be configured such that a Ru content of the Ru alloy contained in the first Ru alloy layer changes in an in-plane direction or a laminating direction of the first Ru alloy layer.

[4] The magnetoresistance effect element according to the above aspect may be configured such that the Ru content of the Ru alloy contained in the first Ru alloy layer continuously changes in the laminating direction of the first Ru alloy layer.

[5] The magnetoresistance effect element according to the above aspect may be configured such that the Ru content of the Ru alloy contained in the first Ru alloy layer increases from a surface of the first Ru alloy layer on the first ferromagnetic layer side toward a surface of the first Ru alloy layer on a side opposite to the first ferromagnetic layer side.

[6] The magnetoresistance effect element according to the above aspect may be configured such that at least one of the Heusler alloy contained in the first ferromagnetic layer and the Heusler alloy contained in the second ferromagnetic layer contains one or more Heusler alloys represented by the following general formula (2), $$Co_2(Fe_{1-\beta},M1_\beta)M2 \quad (2)$$

where, in the general formula (2), the symbol M1 represents Mn or Ti, the symbol M2 represents one or more elements selected from the group consisting of Si, Al, Ga, Ge, and Sn, and the symbol β represents a number satisfying $0 \leq \beta \leq 1$.

[7] The magnetoresistance effect element according to the aspect described in the above [6] may be configured such that the Heusler alloy is one or more alloys selected from the group consisting of $Co_2Fe(GaGe)$, $Co_2(MnFe)Ge$, and $Co_2(FeMn)(GaGe)$.

[8] The magnetoresistance effect element according to the aspect described in the above [6] or [7] may be configured such that the first ferromagnetic layer contains the Heusler alloy represented by the general formula (2), and the Heusler alloy contained in a surface of the first ferromagnetic layer on the first Ru alloy layer side has a large amount of Co and Fe as compared with the Heusler alloy contained in a surface thereof on a side opposite to the first Ru alloy layer side.

[9] The magnetoresistance effect element according to the aspect described in any one of the above [6] to [8] may be configured such that the second ferromagnetic layer contains the Heusler alloy represented by the general formula (2), and the Heusler alloy contained in an interface of the second ferromagnetic layer on a side opposite to the non-magnetic metal layer side has a large amount of Co and Fe as compared with the Heusler alloy contained in an interface of the second ferromagnetic layer on the non-magnetic metal layer side.

[10] The magnetoresistance effect element according to the above aspect may be configured such that a CoFeB layer or a CoFe layer is provided between the first ferromagnetic layer and the first Ru alloy layer.

[11] The magnetoresistance effect element according to the above aspect may be configured such that a second Ru alloy layer is provided on a surface of the second ferromagnetic layer on a side opposite to the non-magnetic metal layer, and the second Ru alloy layer contains one or more Ru alloys represented by the general formula (1).

[12] The magnetoresistance effect element according to the aspect described in the above [11] may be configured such that a CoFeB layer or a CoFe layer is provided between the second ferromagnetic layer and the second Ru alloy layer.

[13] The magnetoresistance effect element according to the above aspect may be configured such that the non-magnetic metal layer contains Ag or a Ag alloy.

According to the present disclosure, it is possible to provide a magnetoresistance effect element that can be manufactured at a relatively low temperature and has a large MR ratio.

DETAILED DESCRIPTION OF THE INVENTION

Figure 1:
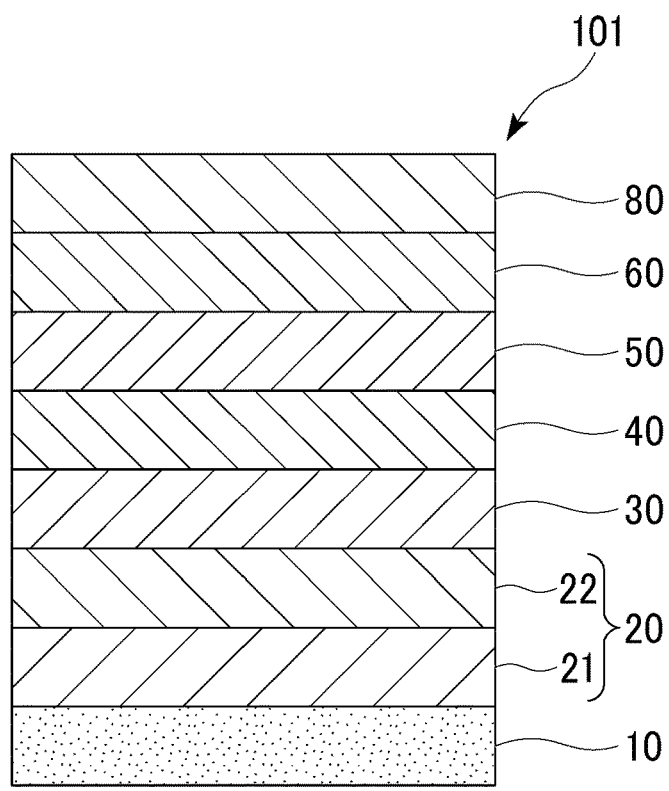
FIG. 1 is a cross-sectional view of a magnetoresistance effect element according to a first embodiment.

The present disclosure will be described in detail below with reference to the drawings as appropriate. In the drawings used in the following description, in order to make features of the present disclosure easier to understand, characteristic portions thereof may be shown enlarged for convenience, and dimensional ratios and the like of respective constituent elements may be different from actual ones. Materials, dimensions, and the like illustrated in the following description are examples, and the present disclosure is not limited thereto and may be appropriately modified and implemented within the range not changing the gist thereof.

First Embodiment

FIG. 1 is a cross-sectional view of a magnetoresistance effect element according to a first embodiment. First, directions will be defined. A direction in which respective layers are laminated may be referred to as a laminating direction. In addition, a direction that intersects the laminating direction and in which the respective layers extend may be referred to as an in-plane direction. FIG. 1 is a cross-sectional view of a magnetoresistance effect element 101 cut in the laminating direction of the respective layers.

The magnetoresistance effect element 101 shown in FIG. 1 is a laminate in which an underlayer 20, a first Ru alloy layer 30, a first ferromagnetic layer 40, a non-magnetic metal layer 50, a second ferromagnetic layer 60, and a cap layer 80 are laminated on a substrate 10 in order.

(Substrate)

The substrate 10 is a portion serving as a base for the magnetoresistance effect element 101. The substrate 10 may be a crystalline substrate or an amorphous substrate. A crystalline substrate is made of, for example, a metal oxide single crystal, a silicon single crystal, a sapphire single crystal, or ceramics. An amorphous substrate is made of, for example, a silicon single crystal with a thermal oxide film, glass, or quartz. When the substrate 10 is amorphous, the influence of a crystal structure of the substrate 10 on a crystal structure of the laminate can be reduced. The magnetoresistance effect element 101 may be used without the substrate 10.

(Underlayer)

The underlayer 20 is located between the substrate 10 and the first ferromagnetic layer 40. The underlayer 20 is a laminate having a two-layered structure in which a first underlayer 21 and a second underlayer 22 are laminated on the substrate 10. The underlayer 20 may be a single layer or a plurality of layers. The underlayer 20 may be used as an electrode for passing an electric current for detection.

The first underlayer 21 functions as a seed layer that enhances the crystallinity of an upper layer laminated on the first underlayer 21. The first underlayer 21 may be a layer containing at least one of MgO, TiN, and NiTa alloys. Also, the first underlayer 21 may be an alloy layer containing Co and Fe. The alloy containing Co and Fe is, for example, Co—Fe or Co—Fe—B. Further, the first underlayer 21 may be a layer containing at least one of metal elements such as Ag, Au, Cu, Cr, V, Al, W, and Pt, for example. A thickness of the first underlayer 21 may be, for example, in the range of 2 nm or more and 30 nm or less.

The second underlayer 22 functions as a buffer layer that alleviates the lattice mismatch between the first underlayer 21 and the first Ru alloy layer 30. The second underlayer 22 may be one that can be used as an electrode for passing the electric current for detection. The second underlayer 22 may be a layer containing at least one of metal elements such as Ag, Au, Cu, Cr, V, Al, W, and Pt, for example. In addition, it may be a layer containing any one of a metal, an alloy, an intermetal compound, a metal boride, a metal carbide, a metal silicate, and a metal phosphide, which have a function of generating a spin current due to the spin Hall effect when an electric current flows. Further, for example, it may be a layer that has a (001) oriented tetragonal or cubic structure and contains at least one element selected from the group consisting of Al, Cr, Fe, Co, Rh, Pd, Ag, Ir, Pt, Au, Mo, W, and Pt. The second underlayer 22 may be a laminate made of materials containing alloys of the metal elements, or two or more of the metal elements. The alloys of the metal elements include, for example, a cubic AgZn alloy, an AgMg alloy, a CoAl alloy, an FeAl alloy, and a NiAl alloy. The thickness of the second underlayer 22 may be, for example, in the range of 2 nm or more and 150 nm or less.

(First Ru Alloy Layer)

The first Ru alloy layer 30 is a layer containing one or more Ru alloys represented by the following general formula (1). The first Ru alloy layer may be a layer made of the Ru alloy only.

$$Ru_\alpha X_{1-\alpha} \qquad (1)$$

In the general formula (1), the symbol X represents one or more elements selected from the group consisting of Be, B, Ti, Y, Zr, Nb, Mo, Rh, In, Sn, La, Ce, Nd, Sm, Gd, Dy, Er, Ta, W, Re, Os, and Ir. The symbol X may be one or more elements selected from the group consisting of B, Ti, Zr, Nb, Mo, Rh, Ta, W, Re, Os, and Ir.

The symbol α represents a number satisfying 0.5<α<1. That is, a Ru content of the Ru alloy contained in the first Ru alloy layer 30 is in the range of more than 50 atm % and less than 100 atm %, and the amount of the X element (when there are two or more X elements, a total content thereof) is in the range of more than 0 atm % and less than 50 atm %. The symbol α may be a number satisfying 0.5<α<0.95 or may be a number satisfying 0.6<α<0.95.

The Ru content of the Ru alloy contained in the first Ru alloy layer 30 may be uniform or may change in the in-plane direction or the laminating direction of the first Ru alloy layer 30. For example, the Ru content of the Ru alloy contained in the first Ru alloy layer 30 may continuously change in the laminating direction of the first Ru alloy layer 30. Also, the Ru content of the Ru alloy contained in the first Ru alloy layer 30 may increase from a surface of the first Ru alloy layer 30 on the first ferromagnetic layer 40 side toward a surface of the first Ru alloy layer 30 on a side opposite to the first ferromagnetic layer 40 side (that is, the substrate 10 side). The thickness of the first Ru alloy layer 30 may be, for example, in the range of 0.5 nm or more and 10 nm or less.

(First Ferromagnetic Layer and Second Ferromagnetic Layer)

The first ferromagnetic layer 40 and the second ferromagnetic layer 60 are magnetic materials. The first ferromagnetic layer 40 and the second ferromagnetic layer 60 each have magnetization. The magnetoresistance effect element 101 outputs a change in relative angle between magnetization of the first ferromagnetic layer 40 and magnetization of the second ferromagnetic layer 60 as a change in resistance value.

The magnetization of the second ferromagnetic layer 60 is easier to move than, for example, the magnetization of the first ferromagnetic layer 40. In a case in which a predetermined external force is applied, a magnetization direction of the first ferromagnetic layer 40 does not change (is pinned), and a magnetization direction of the second ferromagnetic layer 60 changes. By changing the magnetization direction of the second ferromagnetic layer 60 with respect to the magnetization direction of the first ferromagnetic layer 40, the resistance value of the magnetoresistance effect element 101 changes. In this case, the first ferromagnetic layer 40 may be referred to as a magnetization pinned layer, and the second ferromagnetic layer 60 may be referred to as a magnetization free layer. Although a case in which the first ferromagnetic layer 40 is a magnetized pinned layer and the second ferromagnetic layer 60 is a magnetized free layer will be described below as an example, this relationship may be reversed. In addition, since the magnetoresistance effect element 101 outputs a change in the relative angle between the magnetization of the first ferromagnetic layer 40 and the magnetization of the second ferromagnetic layer 60 as a change in the resistance value, it may have a configuration in which both of the magnetization of the first ferromagnetic layer 40 and the magnetization of the second ferromagnetic layer 60 move (that is, both of the first ferromagnetic layer 40 and the second ferromagnetic layer 60 are magnetization free layers).

A difference in easiness of movement between the magnetization of the first ferromagnetic layer 40 and the magnetization of the second ferromagnetic layer 60 when a predetermined external force is applied is caused by a difference in coercive force between the first ferromagnetic layer 40 and the second ferromagnetic layer 60. For example, when the thickness of the second ferromagnetic layer 60 is made thinner than the thickness of the first ferromagnetic layer 40, the coercive force of the second ferromagnetic layer 60 becomes smaller than the coercive force of the first ferromagnetic layer 40. Further, for example, an antiferromagnetic layer is provided on a surface of the first ferromagnetic layer 40 on a side opposite to the non-magnetic metal layer 50 with a spacer layer interposed therebetween. The first ferromagnetic layer 40, the spacer layer, and the antiferromagnetic layer become a synthetic antiferromagnetic structure (an SAF structure). The synthetic antiferromagnetic structure includes two magnetic layers sandwiching the spacer layer. The first ferromagnetic layer 40 and the antiferromagnetic layer are antiferromagnetically coupled, and thus the coercive force of the first ferromagnetic layer 40 increases as compared with a case in which there is no antiferromagnetic layer. The antiferromagnetic layer is, for example, IrMn, PtMn, or the like. The spacer layer contains, for example, at least one selected from the group consisting of Ru, Ir, and Rh. A method for creating a difference in coercive force in accordance with a thickness does not require an additional layer such as an antiferromagnetic layer, which may cause parasitic resistance. On the other hand, a method for creating a difference in coercive force using the SAF structure can enhance orientation characteristics of the magnetization of the first ferromagnetic layer 40.

The first ferromagnetic layer 40 and the second ferromagnetic layer 60 each contain a Heusler alloy. The first ferromagnetic layer 40 and the second ferromagnetic layer 60 may each be a layer made of only a Heusler alloy. The first ferromagnetic layer 40 and the second ferromagnetic layer 60 may contain one Heusler alloy, or may contain two or more Heusler alloys. Compositions of the Heusler alloys contained in the first ferromagnetic layer 40 and the second ferromagnetic layer 60 may be the same or different. Also, each of the first ferromagnetic layer 40 and the second ferromagnetic layer 60 may be a single layer or a plurality of layers.

A Heusler alloy is a half metal in which electrons responsible for a current flowing in an alloy have only upward or downward spins, and spin polarizability is ideally 100%. At least one of the Heusler alloy contained in the first ferromagnetic layer 40 and the Heusler alloy contained in the second ferromagnetic layer 60 may contain one or more Heusler alloys represented by the following general formula (2). The Heusler alloy represented by the following general formula (2) may be contained in both of the first ferromagnetic layer 40 and the second ferromagnetic layer 60.

$$Co_2(Fe_{1-\beta}, M1_\beta)M2 \quad (2)$$

In the general formula (2), the symbol M1 represents Mn or Ti, the symbol M2 represents one or more elements selected from the group consisting of Si, Al, Ga, Ge, and Sn, and the symbol β represents a number satisfying 0≤β≤1.

The first ferromagnetic layer 40 and the second ferromagnetic layer 60 may have the same thickness. The thicknesses of the first ferromagnetic layer 40 and the second ferromagnetic layer 60 may be, for example, in the range of 2 nm or more and 20 nm or less.

(Non-Magnetic Metal Layer)

The non-magnetic metal layer 50 hinders the magnetic coupling between the first ferromagnetic layer 40 and the second ferromagnetic layer 60. The non-magnetic metal layer 50 contains a non-magnetic metal. The non-magnetic metal layer 50 may be a layer made of a non-magnetic metal. The non-magnetic metal layer 50 preferably contains one or more elements selected from the group consisting of Ag, Cu, Au, Ag, Al, and Cr as a main component. Being a main constituent element means that the ratio of Cu, Au, Ag, Al, or Cr in a composition formula is 50% or more. The non-magnetic metal layer 50 preferably contains Ag, and preferably contains Ag as the main constituent element. Since Ag has a long spin diffusion length, the MR ratio becomes larger in the magnetoresistance effect element 101 using Ag.

A thickness of the non-magnetic metal layer 50 may be, for example, in the range of 1 nm or more and 10 nm or less.

(Cap Layer)

The cap layer 80 is located on a side opposite to the substrate 10 of the magnetoresistance effect element 101. The cap layer 80 protects the second ferromagnetic layer 60. The cap layer 80 inhibits diffusion of atoms from the second ferromagnetic layer 60. In addition, the cap layer 80 also contributes to crystal orientation characteristics of each layer of the magnetoresistance effect element 101. The magnetizations of the first ferromagnetic layer 40 and the second ferromagnetic layer 60 are stabilized more by the cap layer 80, and thus the MR ratio of the magnetoresistance effect element 101 is improved. The cap layer 80 may be a single layer or a plurality of layers. The cap layer 80 may be used as an electrode for passing the electric current for detection.

The cap layer 80 may contain, for example, one or more elements selected from the group consisting of Al, Si, Cr, Fe, Co, Ni, Cu, Se, Ru, Rh, Pd, Ag, Te, Pt, Au, B, C, Ti, and Ta. The cap layer 80 may contain, for example, one or more elements selected from the group consisting of Al, Si, Cr, Fe, Co, Ni, Cu, Se, Ru, Rh, Pd, Ag, Te, Pt, and Au, and one or more elements selected from the group consisting of N, B, C, Ti, and Ta. The cap layer 80 may contain, for example, one or more elements selected from Ru, Ag, Al, Cu, Au, Cr, Mo, Pt, W, Ta, Pd, and Ir.

The thickness of the cap layer 80 may be, for example, in the range of 2 nm or more and 10 nm or less.

Composition analysis of each layer constituting the magnetoresistance effect element can be performed using energy dispersive X-ray analysis (EDS). Also, by performing EDS analysis, for example, a composition distribution in a film thickness direction of each material can be confirmed.

The magnetoresistance effect element 101 according to the present embodiment can be manufactured, for example, by laminating the underlayer 20 (the first underlayer 21 and the second underlayer 22), the first Ru alloy layer 30, the first ferromagnetic layer 40, the non-magnetic metal layer 50, the second ferromagnetic layer 60, and the cap layer 80 on the substrate 10 in order. For a film forming method of each layer, for example, a sputtering method, a vapor deposition method, a laser ablation method, or a molecular beam epitaxy (MBE) method can be used.

In the magnetoresistance effect element 101 of the present embodiment having the above configuration, the first ferromagnetic layer 40, the non-magnetic metal layer 50, and the second ferromagnetic layer 60 are laminated on the first Ru alloy layer 30, the first Ru alloy layer 30 contains one or more Ru alloys represented by the above general formula (1), the first ferromagnetic layer 40 and the second ferromagnetic layer 60 include the Heusler alloys, and thus it can be manufactured at a relatively low temperature and has an improved MR ratio.

Although embodiments of the present disclosure have been described in detail with reference to the drawings, configurations and combinations thereof in respective embodiments are examples, and additions, omissions, substitutions, and other modifications of the configurations can be made within the range not departing from the gist of the present disclosure.

Modified examples of the magnetoresistance effect element 101 are shown in FIGS. 2 to 5.

Figure 2:
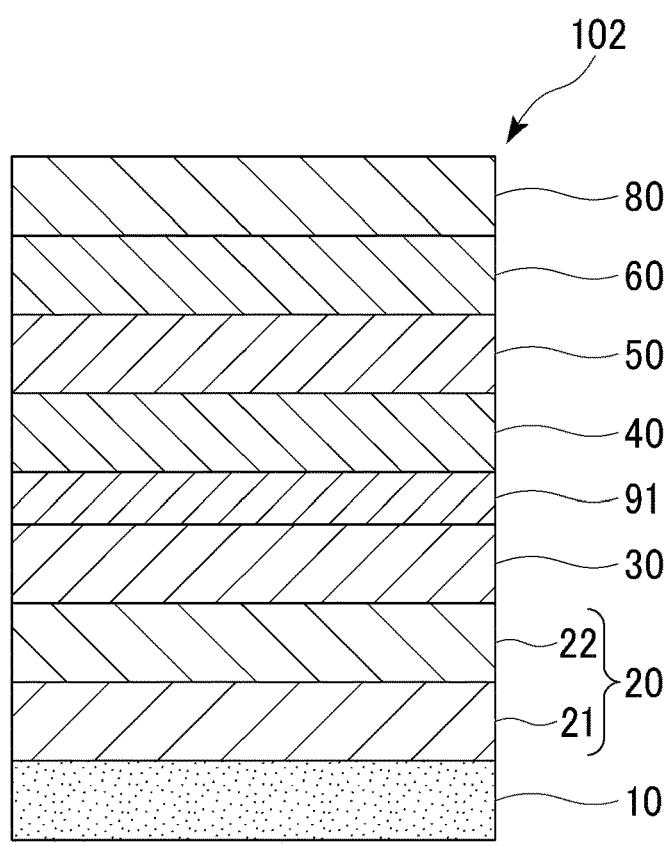
FIG. 2 is a cross-sectional view of a magnetoresistance effect element according to a first modified example.

FIG. 2 is a cross-sectional view of a magnetoresistance effect element according to a first modified example.

A magnetoresistance effect element 102 shown in FIG. 2 is different from the magnetoresistance effect element 101 shown in FIG. 1 in that a first CoFeB layer 91 is disposed between the first Ru alloy layer 30 and the first ferromagnetic layer 40. For this reason, in FIG. 2, the same constituent elements as those in FIG. 1 will be denoted by the same reference numerals, and descriptions thereof will be omitted.

The first CoFeB layer 91 contains Co, Fe, and B. The first CoFeB layer 91 may be a layer made of only Fe, Co, and B. A thickness of the first CoFeB layer 91 may be, for example, in the range of 0.2 nm or more and 10 nm or less.

For a film forming method of the first CoFeB layer 91, for example, a sputtering method, a vapor deposition method, a laser ablation method, or a molecular beam epitaxial (MBE) method can be used.

In the magnetoresistance effect element 102 according to the first modified example, the first CoFeB layer 91 is disposed between the first Ru alloy layer 30 and the first ferromagnetic layer 40, and thus the MR ratio is further improved. Instead of the first CoFeB layer 91, a CoFe layer containing Co and Fe may be provided.

Figure 3:
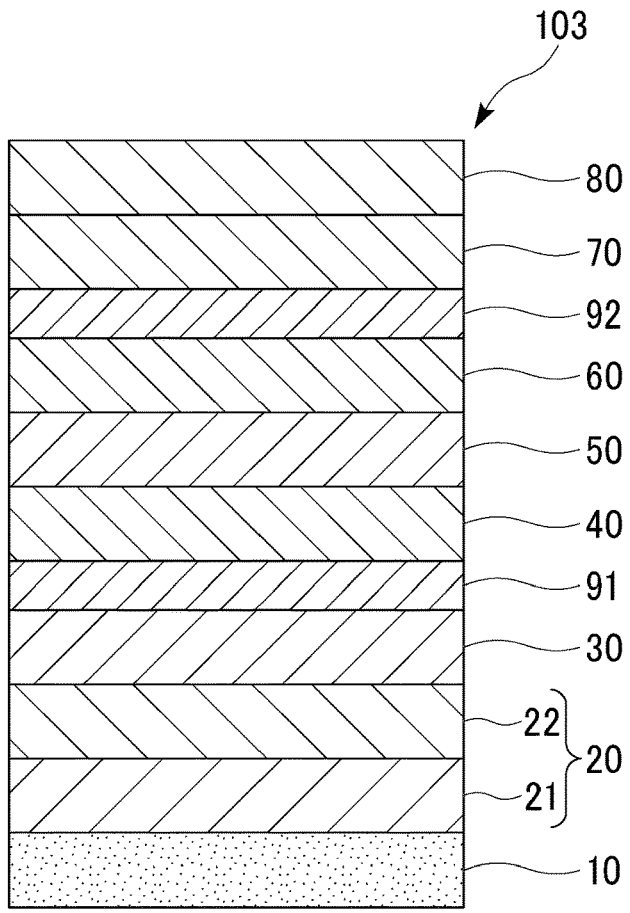
FIG. 3 is a cross-sectional view of a magnetoresistance effect element according to a second modified example.

FIG. 3 is a cross-sectional view of a magnetoresistance effect element according to a second modified example.

A magnetoresistance effect element 103 shown in FIG. 3 is different from the magnetoresistance effect element 101 shown in FIG. 1 in that the first CoFeB layer 91 is disposed between the first Ru alloy layer 30 and the first ferromagnetic layer 40, a second Ru alloy layer 70 is provided on a side of the second ferromagnetic layer 60 (the cap layer 80 side) opposite to the non-magnetic metal layer 50 side, and a second CoFeB layer 92 is disposed between the second Ru alloy layer 70 and the second ferromagnetic layer 60. For this reason, in FIG. 3, the same constituent elements as those in FIG. 1 will be denoted by the same reference numerals, and descriptions thereof will be omitted.

The second Ru alloy layer 70 contains one or more Ru alloys represented by the general formula (1), similarly to the first Ru alloy layer 30. The second Ru alloy layer 70 may be a layer made of only the Ru alloy represented by the general formula (1). The Ru alloy contained in the second Ru alloy layer 70 and the Ru alloy contained in the first Ru alloy layer 30 may be the same or different. Also, in a case in which the second Ru alloy layer 70 is provided, the cap layer 80 may be omitted. The thickness of the second Ru alloy layer 70 may be, for example, in the range of 0.5 nm or more and 10 nm or less.

The second CoFeB layer 92 contains Co, Fe, and B. The second CoFeB layer 92 may be a layer made of only Fe, Co, and B. The thickness of the second CoFeB layer 92 may be, for example, in the range of 0.2 nm or more and 10 nm or less.

For a film forming method of the second Ru alloy layer 70 and the second CoFeB layer 92, for example, a sputtering method, a vapor deposition method, a laser ablation method, or a molecular beam epitaxial (MBE) method can be used.

In the magnetoresistance effect element 103 according to the second modification, the first CoFeB layer 91 is disposed between the first Ru alloy layer 30 and the first ferromagnetic layer 40, the second Ru alloy layer 70 is provided, and the second CoFeB layer 92 is disposed between the second Ru alloy layer 70 and the second ferromagnetic layer 60, and thus the MR ratio is further improved. Instead of the first CoFeB layer 91 and the second CoFeB layer 92, a CoFe layer containing Co and Fe may be provided.

Figure 4:
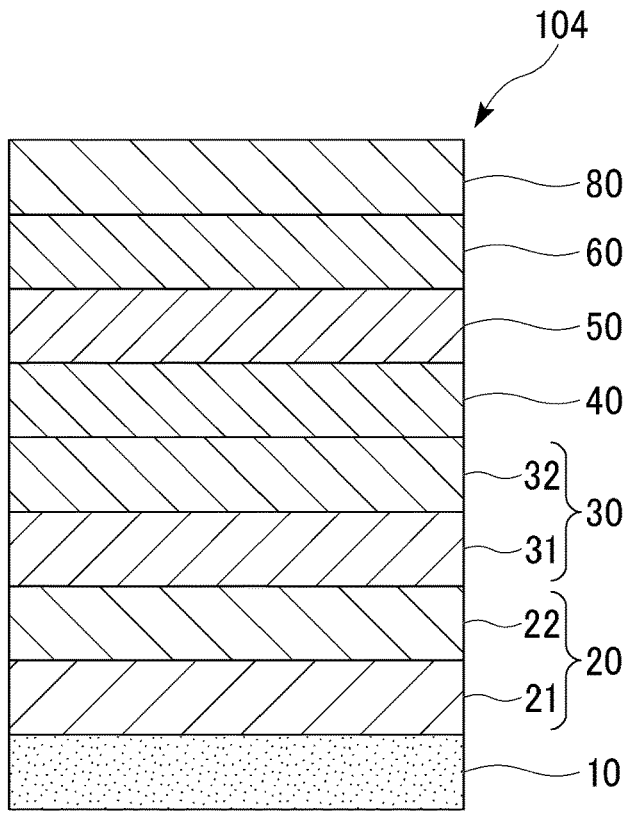
FIG. 4 is a cross-sectional view of a magnetoresistance effect element according to a third modified example.

FIG. 4 is a cross-sectional view of a magnetoresistance effect element according to a third modified example.

A magnetoresistance effect element 104 shown in FIG. 4 is different from the magnetoresistance effect element 101 shown in FIG. 1 in that the first Ru alloy layer 30 is a laminate having a two-layered structure in which a Ru content of a Ru alloy differs in the laminating direction. For this reason, in FIG. 4, the same constituent elements as those in FIG. 1 will be denoted by the same reference numerals, and descriptions thereof will be omitted.

A lower first Ru alloy layer 31 on a lower side (the substrate 10 side) of the first Ru alloy layer 30 in the laminating direction has a relatively high Ru content and a relatively low amount of the X element as compared with an upper first Ru alloy layer 32 on an upper side (the first ferromagnetic layer 40 side) thereof in the laminating direction. The lower first Ru alloy layer 31 and the upper first Ru alloy layer 32 can be formed by changing a sputtering speed of a sputtering device between the lower first Ru alloy layer 31 and the upper first Ru alloy layer 32, for example, using a co-sputtering method using a Ru target and an X element target. The thickness of the lower first Ru alloy layer 31 may be, for example, in the range of 0.2 nm or more and 10 nm or less. The thickness of the upper first Ru alloy layer 32 may be, for example, in the range of 0.2 nm or more and 10 nm or less.

In the magnetoresistance effect element 104 according to the third modified example, the first Ru alloy layer 30 is a laminate having a two-layered structure of the lower first Ru alloy layer 31 and the upper first Ru alloy layer 32, and the lower first Ru alloy layer 31 has a relatively high Ru content and a relatively low amount of the X element as compared with the upper first Ru alloy layer 32, and thus the MR ratio is further improved.

Figure 5:
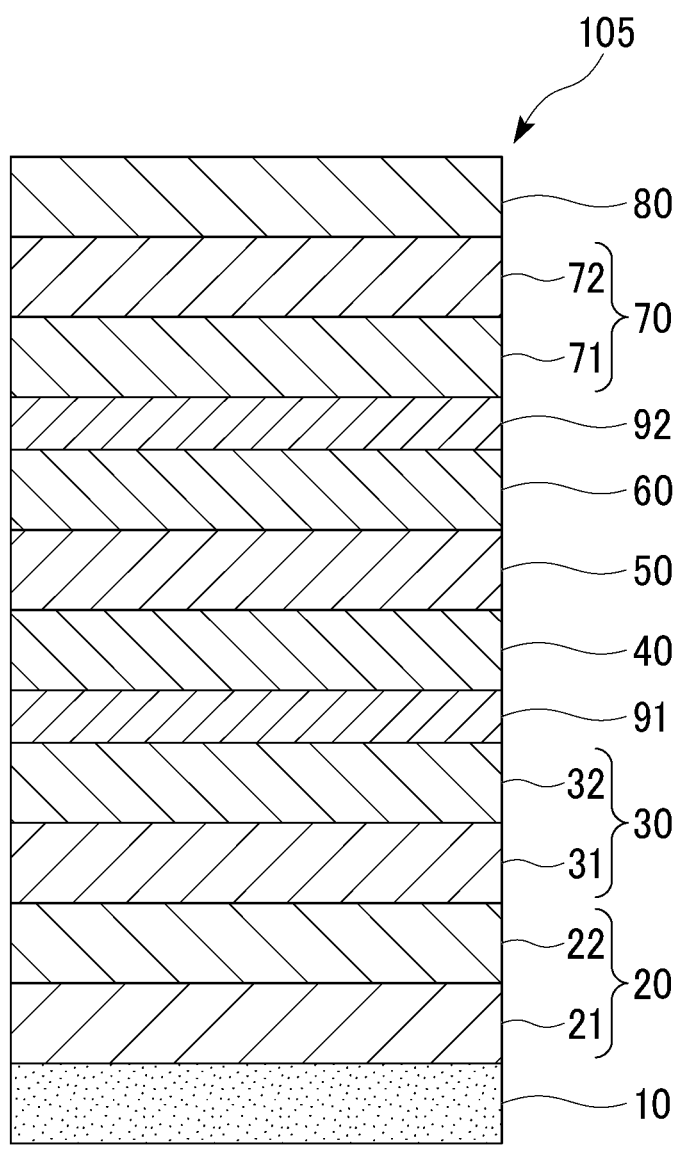
FIG. 5 is a cross-sectional view of a magnetoresistance effect element according to a fourth modified example.

FIG. 5 is a cross-sectional view of a magnetoresistance effect element according to a fourth modified example.

A magnetoresistance effect element 105 shown in FIG. 5 is different from the magnetoresistance effect element 101 shown in FIG. 1 in that the first CoFeB layer 91 is disposed between the first Ru alloy layer 30 and the first ferromagnetic layer 40, the second Ru alloy layer 70 is provided on a side of the second ferromagnetic layer 60 (the cap layer 80 side) opposite to the non-magnetic metal layer 50 side, the second CoFeB layer 92 is disposed between the second Ru alloy layer 70 and the second ferromagnetic layer 60, and the first Ru alloy layer 30 and the second Ru alloy layer 70 are laminates each having a two-layered structure in which a Ru content of a Ru alloy differs in the laminating direction. For this reason, in FIG. 5, the same constituent elements as those in FIG. 1 will be denoted by the same reference numerals, and descriptions thereof will be omitted.

The first CoFeB layer 91 is the same as in the case of the magnetoresistance effect element 102 of the first modified example. The second CoFeB layer 92 is the same as in the case of the magnetoresistance effect element 103 of the second modified example. The lower first Ru alloy layer 31 and the upper first Ru alloy layer 32 of the first Ru alloy layer 30 are the same as in the case of the magnetoresistance effect element 104 of the third modified example.

A lower second Ru alloy layer 71 on a lower side (the second ferromagnetic layer 60 side) of the second Ru alloy layer 70 in the laminating direction has a relatively low Ru content and a relatively high amount of the X element as compared with an upper second Ru alloy layer 72 on an upper side (the cap layer 80 side) thereof in the laminating direction. Thicknesses and a film forming method of the lower second Ru alloy layer 71 and the upper second Ru alloy layer 72 can be the same as in the case of the lower first Ru alloy layer 31 and the upper first Ru alloy layer 32.

In the magnetoresistance effect element 105 according to the fourth modified example, the first CoFeB layer 91 is disposed between the first Ru alloy layer 30 and the first ferromagnetic layer 40, the second Ru alloy layer 70 is provided, and the second CoFeB layer 92 is disposed between the second Ru alloy layer 70 and the second ferromagnetic layer 60, the lower first Ru alloy layer 31 has a relatively high Ru content and a relatively low amount of the X element as compared with the upper first Ru alloy layer 32, the lower second Ru alloy layer 71 has a relatively low Ru content and a relatively high amount of the X element as compared with the upper second Ru alloy layer 72, and thus the MR ratio is further improved.

The above-mentioned magnetoresistance effect elements 101 to 105 can be used for various purposes. The magnetoresistance effect elements 101 to 105 can be applied to, for example, a magnetic head, a magnetic sensor, a magnetic memory, a high frequency filter, and the like. Next, application examples of the magnetoresistance effect elements will be described by taking a case in which the magnetoresistance effect element 101 is used as a magnetoresistance effect element as an example.

Figure 6:
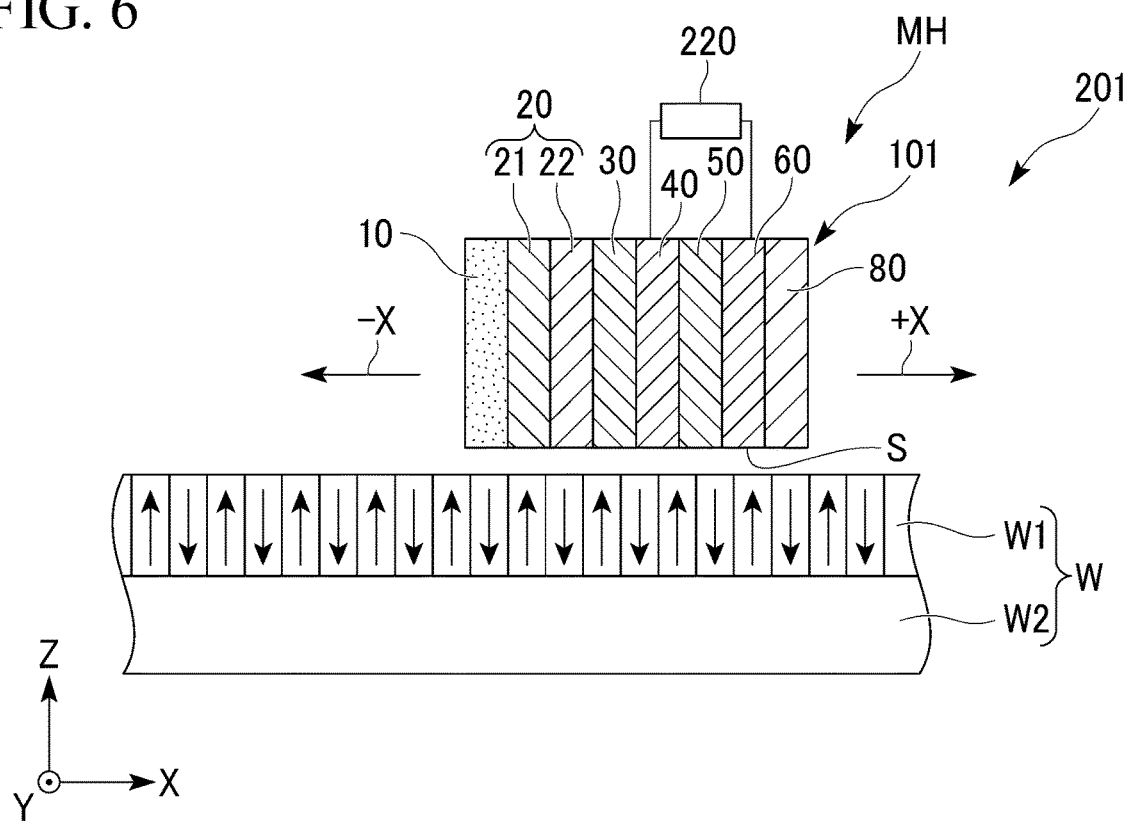
FIG. 6 is a cross-sectional view of a magnetic recording element according to Application Example 1.

FIG. 6 is a cross-sectional view of a magnetic recording element 201 according to Application Example 1. FIG. 6 is a cross-sectional view of the magnetic recording element 201 cut in the laminating direction.

As shown in FIG. 6, the magnetic recording element 201 has a magnetic head MH and a magnetic recording medium W. In FIG. 6, one direction in which the magnetic recording medium W extends is an X direction, and a direction perpendicular to the X direction is a Y direction. An XY plane is parallel to a main plane of the magnetic recording medium W. A direction that connects the magnetic recording medium W to the magnetic head MH and is perpendicular to the XY plane is defined as a Z direction.

The magnetic head MH has an air bearing surface (a medium facing surface) S that faces a surface of the magnetic recording medium W. The magnetic head MH moves in directions of arrow +X and arrow −X along the surface of the magnetic recording medium W at a position separated by a certain distance from the magnetic recording medium W. The magnetic head MH has a magnetoresistance effect element 101 that acts as a magnetic sensor, and a magnetic recording unit (not shown). A resistance measuring instrument 220 measures a resistance value of the magnetoresistance effect element 101 in the laminating direction.

The magnetic recording unit applies a magnetic field to a recording layer W1 of the magnetic recording medium W to determine a magnetization direction of the recording layer W1. That is, the magnetic recording unit performs magnetic recording of the magnetic recording medium W. The magnetoresistance effect element 101 reads information on the magnetization of the recording layer W1 written by the magnetic recording unit.

The magnetic recording medium W has the recording layer W1 and a backing layer W2. The recording layer W1 is a portion for performing the magnetic recording, and the backing layer W2 is a magnetic path (a path for magnetic flux) for circulating magnetic flux for writing back to the magnetic head MH. The recording layer W1 records magnetic information as a magnetization direction.

The second ferromagnetic layer 60 of the magnetoresistance effect element 101 is, for example, a magnetization free layer. For this reason, the second ferromagnetic layer 60 exposed on the air bearing surface S is affected by the magnetization recorded on the recording layer W1 of the opposing magnetic recording medium W. For example, in FIG. 6, a magnetization direction of the second ferromagnetic layer 60 is directed in the +Z direction due to the influence of magnetization of the recording layer W1 in the +Z direction. In this case, magnetization directions of the first ferromagnetic layer 40 and the second ferromagnetic layer 60, which are magnetization pinned layers, are parallel to each other.

Here, a resistance in a case in which the magnetization directions of the first ferromagnetic layer 40 and the second ferromagnetic layer 60 are parallel is different from a resistance in a case in which the magnetization directions of the first ferromagnetic layer 40 and the second ferromagnetic layer 60 are antiparallel. As a difference between a resistance value in the case of being parallel and a resistance value in the case of being antiparallel increases, the MR ratio of the magnetoresistance effect element 101 increases. The magnetoresistance effect element 101 according to the present embodiment has a large MR ratio. Accordingly, the resistance measuring instrument 220 can accurately read the information on the magnetization of the recording layer W1 as a change in the resistance value.

A shape of the magnetoresistance effect element 101 of the magnetic head MH is not particularly limited. For example, in order to avoid the influence of a leaked magnetic field of the magnetic recording medium W on the first ferromagnetic layer 40 of the magnetoresistance effect element 101, the first ferromagnetic layer 40 may be provided at a position separated from the magnetic recording medium W.

Figure 7:
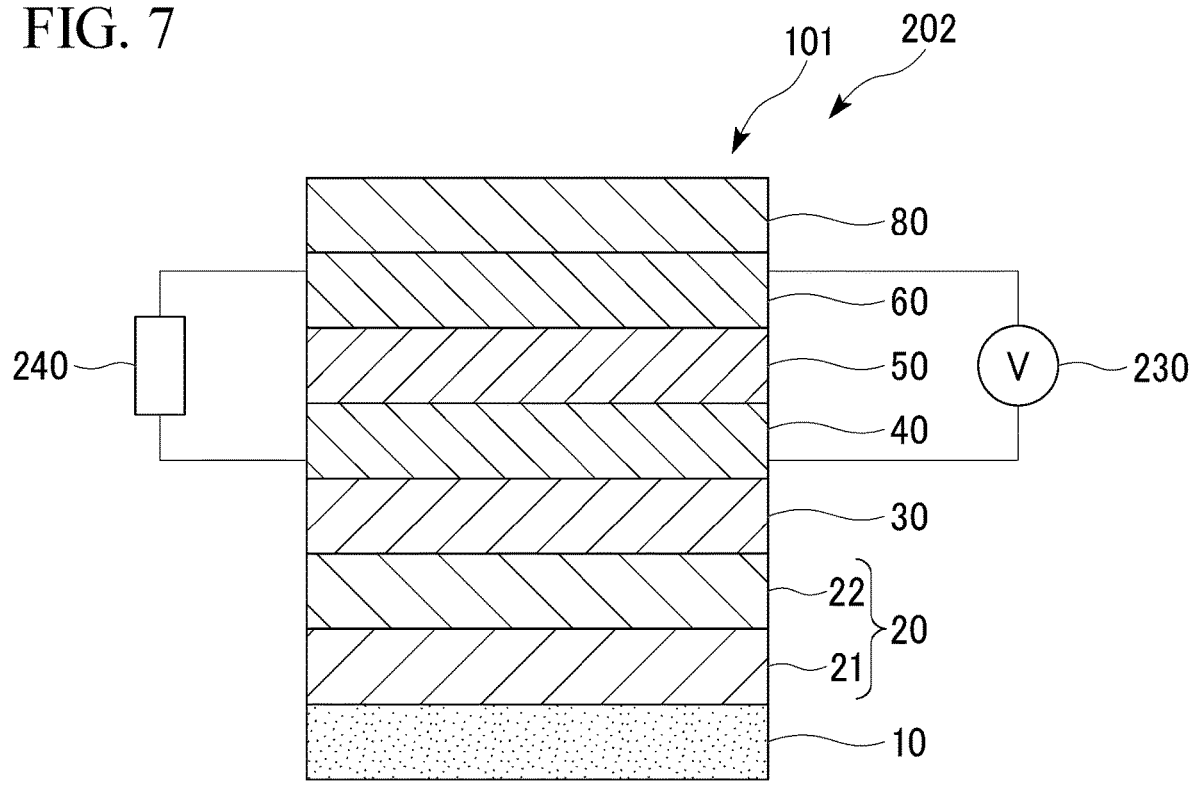
FIG. 7 is a cross-sectional view of a magnetic recording element according to Application Example 2.

FIG. 7 is a cross-sectional view of a magnetic recording element 202 according to Application Example 2. FIG. 7 is a cross-sectional view of the magnetic recording element 202 cut in the laminating direction.

As shown in FIG. 7, the magnetic recording element 202 has a magnetoresistance effect element 101, a power supply 230, and a measuring unit 240. The power supply 230 applies a potential difference in the laminating direction of the magnetoresistance effect element 101. The power supply 230 is, for example, a DC power supply. The measuring unit 240 measures the resistance value of the magnetoresistance effect element 101 in the laminating direction.

When a potential difference is generated between the first ferromagnetic layer 40 and the second ferromagnetic layer 60 by the power supply 230, an electric current flows in the laminating direction of the magnetoresistance effect element 101. The electric current is spin-polarized when passing through the first ferromagnetic layer 40, and becomes a spin-polarized current. The spin-polarized current reaches the second ferromagnetic layer 60 via the non-magnetic metal layer 50. The magnetization of the second ferromagnetic layer 60 receives a spin transfer torque (STT) due to the spin-polarized current and is reversed. By changing the relative angle between the magnetization direction of the first ferromagnetic layer 40 and the magnetization direction of the second ferromagnetic layer 60, the resistance value of the magnetoresistance effect element 101 in the laminating direction changes. The resistance value of the magnetoresistance effect element 101 in the laminating direction is read out by the measuring unit 240. That is, the magnetic recording element 202 shown in FIG. 7 is a spin transfer torque (STT) type magnetic recording element.

Figure 8:
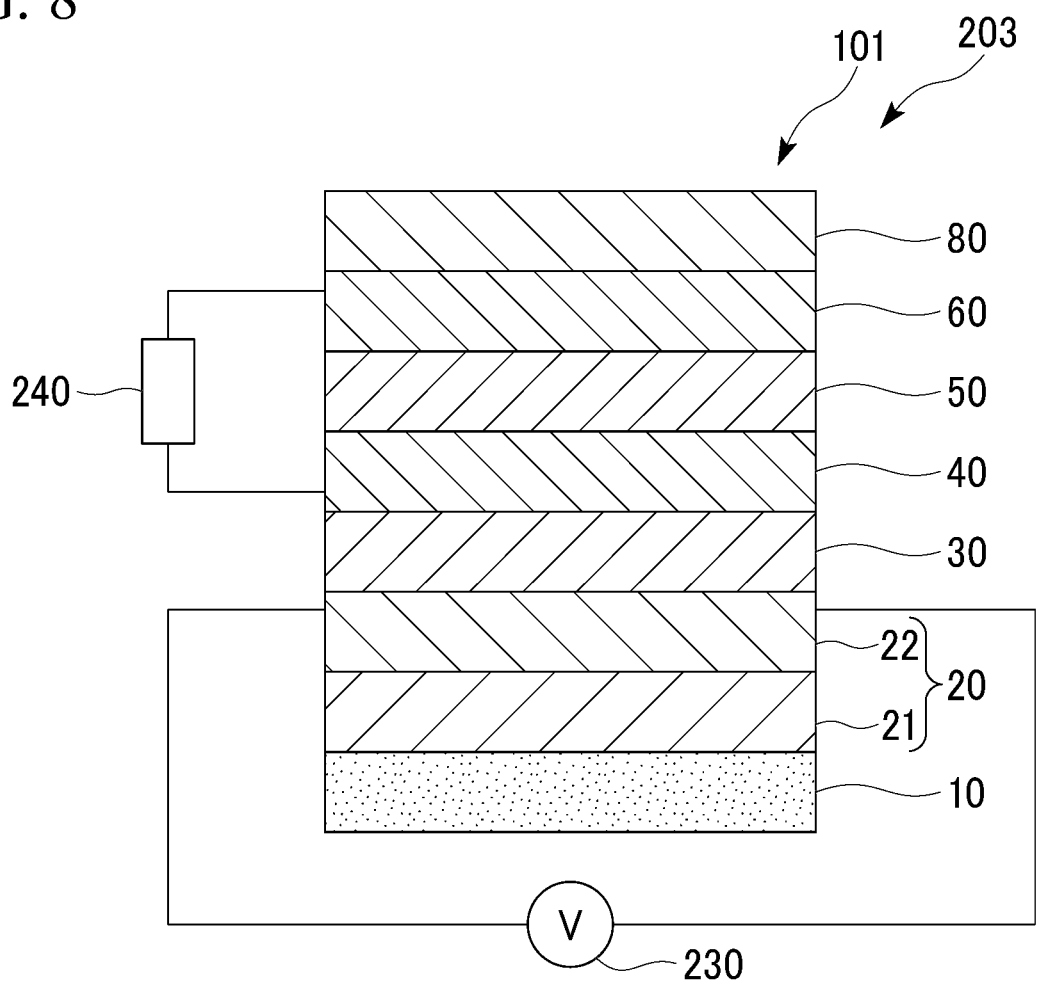
FIG. 8 is a cross-sectional view of a magnetic recording element according to Application Example 3.

FIG. 8 is a cross-sectional view of a magnetic recording element 203 according to Application Example 3. FIG. 8 is a cross-sectional view of the magnetic recording element 203 cut in the laminating direction. In the magnetoresistance effect element 101 shown in FIG. 8, the first ferromagnetic layer 40 is a magnetization free layer, and the second ferromagnetic layer 60 is a magnetization pinned layer.

As shown in FIG. 8, in the magnetic recording element 203, the second underlayer 22 is a spin-orbit torque wiring $w_{SOT}$. The spin-orbit torque wiring may be disposed between the first underlayer 21 and the second underlayer 22. The second underlayer 22 (spin-orbit torque wiring $w_{SOT}$) extends in one direction of the in-plane direction. The power supply 230 is connected to a first end and a second end of the second underlayer 22. The magnetoresistance effect element 101 is sandwiched between the first end and the second end in a plan view. The power supply 230 causes a write current to flow along the second underlayer 22. The measuring unit 240 measures the resistance value of the magnetoresistance effect element 101 in the laminating direction.

When a potential difference is created between the first end and the second end of the second underlayer 22 by the power supply 230, an electric current flows in the in-plane direction of the second underlayer 22. The second underlayer 22 has a function of generating a spin current due to the spin Hall effect when an electric current flows. The second underlayer 22 contains, for example, any of a metal, an alloy, an intermetallic compound, a metal boride, a metal carbide, a metal silicate, and a metal phosphide, which have a function of generating a spin current due to the spin Hall effect when an electric current flows. For example, the second underlayer 22 contains a non-magnetic metal having an atomic number of 39 or more having d electrons or f electrons in the outermost shell.

When an electric current flows in the in-plane direction of the second underlayer 22, the spin Hall effect is generated due to spin-orbit interaction. The spin Hall effect is a phenomenon in which a moving spin is bent in a direction orthogonal to a direction in which an electric current flows. The spin Hall effect creates uneven distribution of spins in the spin-orbit torque wiring $w_{SOT}$ and induces a spin current in a thickness direction of the second underlayer 22. The spins are injected from the second underlayer 22 into the first ferromagnetic layer 40 via the first Ru alloy layer 30 by the spin current.

The spins injected into the first ferromagnetic layer 40 apply a spin-orbit torque (SOT) to the magnetization of the first ferromagnetic layer 40. The first ferromagnetic layer 40 receives the spin-orbit torque (SOT) and reverses its magnetization. By changing the relative angle between the magnetization direction of the second ferromagnetic layer 60 and the magnetization direction of the first ferromagnetic layer 40, the resistance value of the magnetoresistance effect element 101 in the laminating direction changes. The resistance value of the magnetoresistance effect element 101 in the laminating direction is read out by the measuring unit 240. That is, the magnetic recording element 203 shown in FIG. 8 is a spin-orbit torque (SOT) type magnetic recording element.

Figure 9:
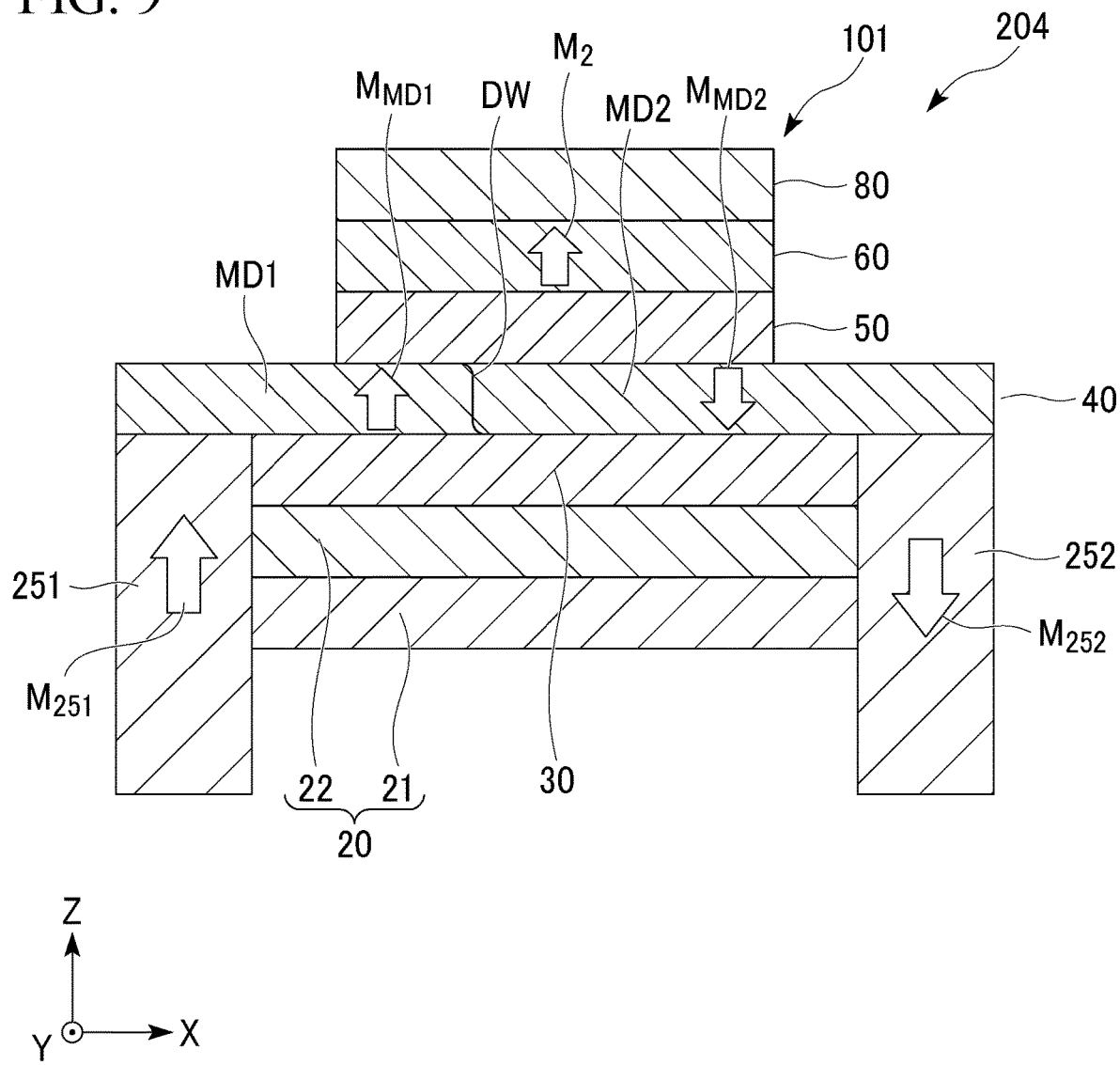
FIG. 9 is a cross-sectional view of a domain wall motion element according to Application Example 4.

FIG. 9 is a cross-sectional view of a domain wall motion element (a domain wall motion type magnetic recording element) according to Application Example 4. The domain wall motion element 204 has a magnetoresistance effect element 101, a first magnetization pinned layer 251 and a second magnetization pinned layer 252. The underlayer 20 and the first Ru alloy layer 30 are, for example, between the first magnetization pinned layer 251 and the second magnetization pinned layer 252 and are located at positions overlapping the second ferromagnetic layer 60. In FIG. 9, a direction in which the first ferromagnetic layer 40 extends is the X direction, a direction perpendicular to the X direction is the Y direction, and a direction perpendicular to the XY plane is the Z direction.

The first magnetization pinned layer 251 and the second magnetization pinned layer 252 are connected to the first end and the second end of the first ferromagnetic layer 40. The first end and the second end sandwich the second ferromagnetic layer 60 and the non-magnetic metal layer 50 in the X direction.

The first ferromagnetic layer 40 is a layer that can magnetically record information by changing its internal magnetic state. The first ferromagnetic layer 40 has a first magnetic domain MD1 and a second magnetic domain MD2 therein. Magnetization of a position of the first ferromagnetic layer 40 that overlaps the first magnetization pinned layer 251 or the second magnetization pinned layer 252 in the Z direction is fixed in one direction. The magnetization of the position that overlaps the first magnetization pinned layer 251 in the Z direction is fixed in the +Z direction, for example, and the magnetization of the position that overlaps the second magnetization pinned layer 252 in the Z direction is fixed in the −Z direction, for example. As a result, a domain wall DW is formed at a boundary between the first magnetic domain MD1 and the second magnetic domain MD2. The first ferromagnetic layer 40 can have the domain wall DW therein. In the first ferromagnetic layer 40 shown in FIG. 9, a magnetization $M_{MD1}$ of the first magnetic domain MD1 is oriented in the +Z direction, and a magnetization $M_{MD2}$ of the second magnetic domain MD2 is oriented in the −Z direction.

The domain wall motion element 204 can record data in multiple values or continuously depending on a position of the domain wall DW of the first ferromagnetic layer 40. The data recorded in the first ferromagnetic layer 40 is read out as a change in a resistance value of the domain wall motion element 204 when a read current is applied.

Proportions of the first magnetic domain MD1 and the second magnetic domain MD2 in the first ferromagnetic layer 40 change as the domain wall DW moves. A magnetization $M_2$ of the second ferromagnetic layer 60 is, for example, in the same direction (parallel) as the magnetization $M_{MD1}$ of the first magnetic domain MD1 and in an opposite direction (antiparallel) to the magnetization $M_{MD2}$ of the second magnetic domain MD2. When the domain wall DW moves in the +X direction, and the area of the first magnetic domain MD1 in a portion overlapping the second ferromagnetic layer 60 in a plan view in the Z direction is widened, the resistance value of the domain wall motion element 204 decreases. On the contrary, when the domain wall DW moves in the −X direction and an area of the second magnetic domain MD2 in a portion overlapping the second ferromagnetic layer 60 in the plan view in the Z direction is widened, the resistance value of the domain wall motion element 204 increases.

The domain wall DW moves by passing a write current in the X direction of the first ferromagnetic layer 40 or by applying an external magnetic field. For example, when a write current (for example, an electric current pulse) is applied in the +X direction of the first ferromagnetic layer 40, electrons flow in the −X direction opposite to the electric current, and thus the domain wall DW moves in the −X direction. When an electric current flows from the first magnetic domain MD1 to the second magnetic domain MD2, the electrons spin-polarized in the second magnetic domain MD2 reverse the magnetization $M_{MD1}$ of the first magnetic domain MD1. By reversing the magnetization $M_{MD1}$ of the first magnetic domain MD1, the domain wall DW moves in the −X direction.

Figure 10:
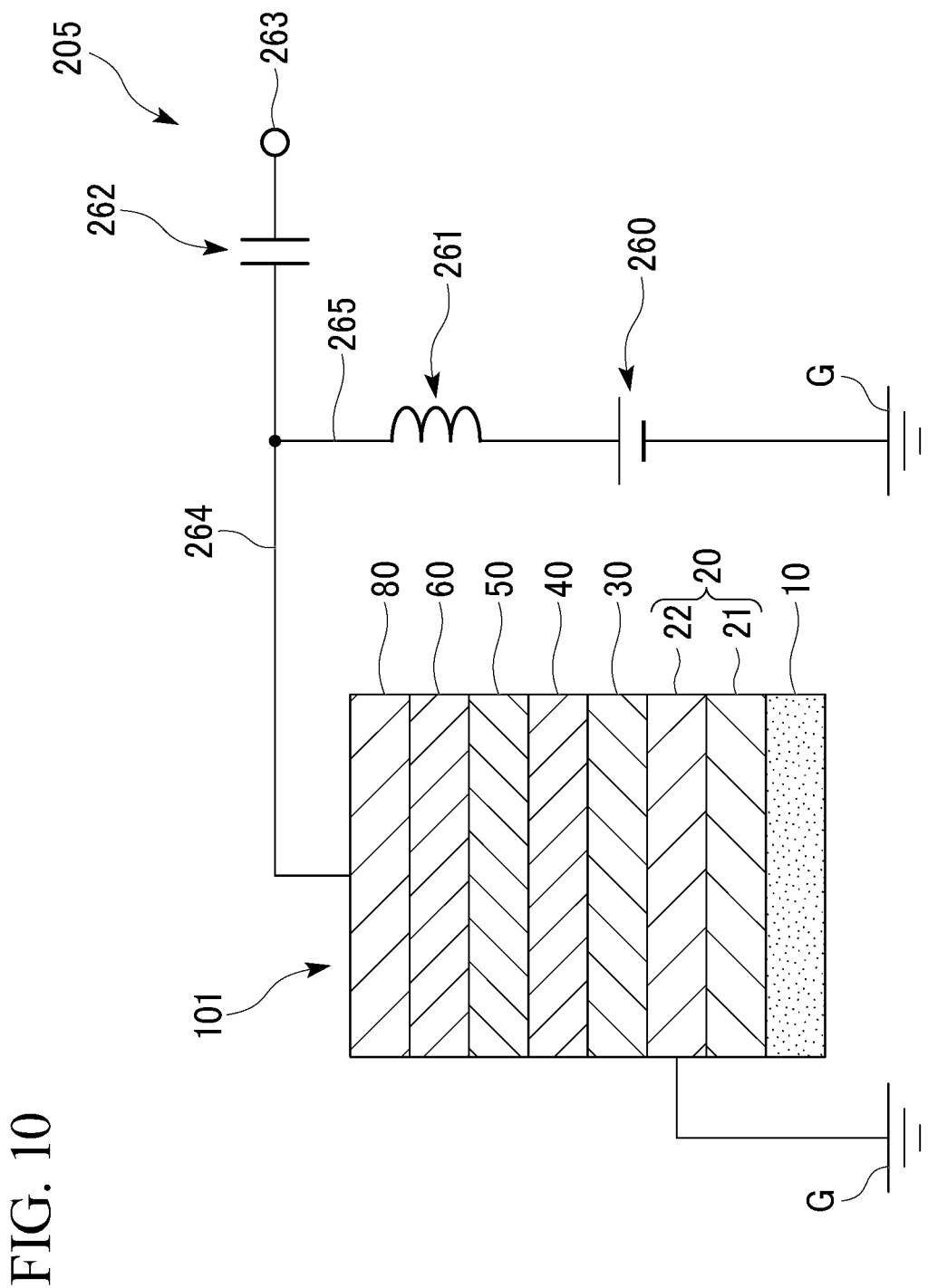
FIG. 10 is a cross-sectional view of a high frequency device according to Application Example 5.

FIG. 10 is a schematic diagram of a high frequency device 205 according to Application Example 5. As shown in FIG. 10, the high frequency device 205 has a magnetoresistance effect element 101, a direct current power supply 260, an inductor 261, a capacitor 262, an output port 263, and wirings 264 and 265.

The wiring 264 connects the magnetoresistance effect element 101 to the output port 263. The wiring 265 branches from the wiring 264 and reaches a ground G via the inductor 261 and the direct current power supply 260. For the direct current power supply 260, the inductor 261, and the capacitor 262, known ones can be used. The inductor 261 cuts a high frequency component of an electric current and allows an invariant component of the electric current to pass therethrough. The capacitor 262 passes a high frequency component of an electric current therethrough and cuts an invariant component of the electric current. The inductor 261 is provided at a portion at which a flow of a high-frequency current is desired to be inhibited, and the capacitor 262 is provided at a portion at which a flow of a direct current is desired to be inhibited.

When an alternating current or an alternating magnetic field is applied to a ferromagnetic layer included in the magnetic resistance effect element 101, the magnetization of the first ferromagnetic layer 40 is subjected to procession. The magnetization of the first ferromagnetic layer 40 oscillates strongly in a case in which a frequency of the high-frequency current or high-frequency magnetic field applied to the first ferromagnetic layer 40 is close to a ferromagnetic resonance frequency of the first ferromagnetic layer 40, and does not oscillate very much at a frequency separated from the ferromagnetic resonance frequency of the first ferromagnetic layer 40. This phenomenon is called a ferromagnetic resonance phenomenon.

The resistance value of the magnetoresistance effect element 101 changes due to the oscillation of the magnetization of the first ferromagnetic layer 40. The direct current power supply 260 applies a direct current to the magnetoresistance effect element 101. The direct current flows in the laminating direction of the magnetoresistance effect element 101. The direct current flows to the ground G through the wirings 264 and 265 and the magnetoresistance effect element 101. A potential of the magnetoresistance effect element 101 changes in accordance with the Ohm's law. A high-frequency signal is output from the output port 263 in response to a change in the potential (a change in the resistance value) of the magnetoresistance effect element 101.

EXAMPLES

Examples 1-1 to 80 and Comparative Examples 1-1 to 48

The magnetoresistance effect element 101 shown in FIG. 1 was manufactured. A structure of each layer was set as follows.
Substrate 10: Silicon single crystal substrate with thermal oxide film, thickness 0.625 mm
Underlayer 20:
First underlayer 21: Cr layer, thickness 10 nm
Second underlayer 22: Ag layer, thickness 100 nm
First Ru alloy layer 30: $Ru_\alpha X_{1-\alpha}$ layer (X is Be, B, Ti, Zr, Nb, Mo, Rh, In, Sn, Nd, Ta, W, Re, Os, and Ir, α is 1, 0.95, 0.90, 0.80, 0.75, 0.60, 0.50, and 0.25.), thickness 5 nm
First ferromagnetic layer 40: $Co_2MnGe$ layer, thickness 10 nm
Non-magnetic metal layer 50: Ag layer, thickness 5 nm
Second ferromagnetic layer 60: $Co_2MnGe$ layer, thickness 7 nm
Cap layer 80: Ru layer, thickness 5 nm
The magnetoresistance effect element 101 was manufactured through the following procedure.

First, the first underlayer 21 was formed using a sputtering method on a thermal oxide film of a silicon single crystal substrate with the thermal oxide film. Next, the second underlayer 22 (Ag layer) was formed on the first underlayer 21 using a sputtering method, thereby forming the underlayer 20. The substrate 10 on which the underlayer 20 was formed was heated at 300° C. for 15 minutes, and then cooled to room temperature.

After the cooling, the first Ru alloy layer 30 ($Ru_\alpha X_{1-\alpha}$ layer) was formed on the underlayer 20 formed on the substrate 10 using a co-sputtering method using a Ru target and an X element target. The amount of the X element in the first Ru alloy layer 30 was adjusted in accordance with a sputtering speed of a sputtering device.

Next, the first ferromagnetic layer 40, the non-magnetic metal layer 50, and the second ferromagnetic layer 60 were formed on the first Ru alloy layer 30 in order using a sputtering method. The substrate 10 on which the second ferromagnetic layer 60 was formed was heated at 500° C. for 15 minutes and then cooled to a room temperature. After the cooling, the cap layer 80 (Ru layer) was formed on the second ferromagnetic layer 60 using an electron beam vapor deposition method.

An MR ratio of the manufactured magnetoresistance effect element 101 was measured. The results are shown in Tables 1A to 1D below and FIG. 11.

For obtaining the MR ratio, a change in the resistance value of the magnetoresistance effect element 101 was measured by monitoring a voltage applied to the magnetoresistance effect element 101 using a voltmeter while sweeping a magnetic field from an outside to the magnetoresistance effect element 101 in a state in which a constant electric current flows in the laminating direction of the magnetoresistance effect element 101. The resistance value in a case in which the magnetization directions of the first ferromagnetic layer 40 and the second ferromagnetic layer 60 are parallel, and the resistance value in a case in which the magnetization directions of the first ferromagnetic layer 40 and the second ferromagnetic layer 60 are antiparallel were measured, and the MR ratio was calculated from the obtained resistance values using the following formula. The measurement of the MR ratio was performed at 300 K (a room temperature).

MR ratio (%)=$(R_{AP}-R_P)/R_P \times 100$ $R_P$ is the resistance value when the directions of magnetization of the first ferromagnetic layer 40 and the second ferromagnetic layer 60 are parallel.

$R_{AP}$ is the resistance value when the directions of magnetization of the first ferromagnetic layer 40 and the second ferromagnetic layer 60 are antiparallel.

TABLE 1A

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Comparative Example 1-1 | Be | 0 | $Co_2MnGe$ | Ag | $Co_2MnGe$ | 2.9 |
| Example 1-1 | | 5 | | | | 4.3 |
| Example 1-2 | | 10 | | | | 5.1 |
| Example 1-3 | | 20 | | | | 5.2 |
| Example 1-4 | | 25 | | | | 5.0 |
| Example 1-5 | | 40 | | | | 4.9 |
| Comparative Example 1-2 | | 50 | | | | 2.6 |
| Comparative Example 1-3 | | 75 | | | | 2.5 |
| Comparative Example 1-4 | B | 0 | $Co_2MnGe$ | Ag | $Co_2MnGe$ | 2.9 |
| Example 1-6 | | 5 | | | | 5.7 |
| Example 1-7 | | 10 | | | | 7.1 |
| Example 1-8 | | 20 | | | | 7.3 |
| Example 1-9 | | 25 | | | | 7.1 |
| Example 1-10 | | 40 | | | | 6.1 |
| Comparative Example 1-5 | | 50 | | | | 3.2 |
| Comparative Example 1-6 | | 75 | | | | 3.0 |

TABLE 1A-continued

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Comparative Example 1-7 | Ti | 0 | $Co_2MnGe$ | Ag | $Co_2MnGe$ | 2.9 |
| Example 1-11 | | 5 | | | | 6.2 |
| Example 1-12 | | 10 | | | | 7.2 |
| Example 1-13 | | 20 | | | | 7.3 |
| Example 1-14 | | 25 | | | | 7.1 |
| Example 1-15 | | 40 | | | | 6.1 |
| Comparative Example 1-8 | | 50 | | | | 2.8 |
| Comparative Example 1-9 | | 75 | | | | 2.8 |
| Comparative Example 1-10 | Y | 0 | $Co_2MnGe$ | Ag | $Co_2MnGe$ | 2.9 |
| Example 1-16 | | 5 | | | | 4.1 |
| Example 1-17 | | 10 | | | | 5.1 |
| Example 1-18 | | 20 | | | | 5.4 |
| Example 1-19 | | 25 | | | | 5.0 |
| Example 1-20 | | 40 | | | | 4.7 |
| Comparative Example 1-11 | | 50 | | | | 2.5 |
| Comparative Example 1-12 | | 75 | | | | 2.3 |

TABLE 1B

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Comparative Example 1-13 | Zr | 0 | $Co_2MnGe$ | Ag | $Co_2MnGe$ | 2.9 |
| Example 1-21 | | 5 | | | | 6.4 |
| Example 1-22 | | 10 | | | | 7.3 |
| Example 1-23 | | 20 | | | | 7.8 |
| Example 1-24 | | 25 | | | | 7.4 |
| Example 1-25 | | 40 | | | | 6.8 |
| Comparative Example 1-14 | | 50 | | | | 3.6 |
| Comparative Example 1-15 | | 75 | | | | 2.6 |
| Comparative Example 1-16 | Nb | 0 | $Co_2MnGe$ | Ag | $Co_2MnGe$ | 2.9 |
| Example 1-26 | | 5 | | | | 6.5 |
| Example 1-27 | | 10 | | | | 7.2 |
| Example 1-28 | | 20 | | | | 7.8 |
| Example 1-29 | | 25 | | | | 7.1 |
| Example 1-30 | | 40 | | | | 6.7 |
| Comparative Example 1-17 | | 50 | | | | 3.9 |
| Comparative Example 1-18 | | 75 | | | | 2.8 |
| Comparative Example 1-19 | Mo | 0 | $Co_2MnGe$ | Ag | $Co_2MnGe$ | 2.9 |
| Example 1-31 | | 5 | | | | 6.0 |
| Example 1-32 | | 10 | | | | 6.7 |
| Example 1-33 | | 20 | | | | 7.2 |
| Example 1-34 | | 25 | | | | 7.2 |
| Example 1-35 | | 40 | | | | 6.0 |
| Comparative Example 1-20 | | 50 | | | | 3.4 |
| Comparative Example 1-21 | | 75 | | | | 2.8 |
| Comparative Example 1-22 | Rh | 0 | $Co_2MnGe$ | Ag | $Co_2MnGe$ | 2.9 |
| Example 1-36 | | 5 | | | | 6.1 |
| Example 1-37 | | 10 | | | | 6.7 |
| Example 1-38 | | 20 | | | | 6.9 |
| Example 1-39 | | 25 | | | | 6.8 |
| Example 1-40 | | 40 | | | | 5.9 |

TABLE 1B-continued

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Comparative Example 1-23 | | 50 | | | | 3.4 |
| Comparative Example 1-24 | | 75 | | | | 2.2 |

TABLE 1C

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Comparative Example 1-25 | In | 0 | $Co_2MnGe$ | Ag | $Co_2MnGe$ | 2.9 |
| Example 1-41 | | 5 | | | | 4.4 |
| Example 1-42 | | 10 | | | | 5.4 |
| Example 1-43 | | 20 | | | | 5.3 |
| Example 1-44 | | 25 | | | | 4.7 |
| Example 1-45 | | 40 | | | | 4.0 |
| Comparative Example 1-26 | | 50 | | | | 2.8 |
| Comparative Example 1-27 | | 75 | | | | 2.5 |
| Comparative Example 1-28 | Sn | 0 | $Co_2MnGe$ | Ag | $Co_2MnGe$ | 2.9 |
| Example 1-46 | | 5 | | | | 4.7 |
| Example 1-47 | | 10 | | | | 5.3 |
| Example 1-48 | | 20 | | | | 5.3 |
| Example 1-49 | | 25 | | | | 5.3 |
| Example 1-50 | | 40 | | | | 5.1 |
| Comparative Example 1-29 | | 50 | | | | 3.8 |
| Comparative Example 1-30 | | 75 | | | | 1.9 |
| Comparative Example 1-31 | Nd | 0 | $Co_2MnGe$ | Ag | $Co_2MnGe$ | 2.9 |
| Example 1-51 | | 5 | | | | 5.0 |
| Example 1-52 | | 10 | | | | 5.7 |
| Example 1-53 | | 20 | | | | 5.1 |
| Example 1-54 | | 25 | | | | 4.8 |
| Example 1-55 | | 40 | | | | 4.4 |
| Comparative Example 1-32 | | 50 | | | | 3.4 |
| Comparative Example 1-33 | | 75 | | | | 2.2 |
| Comparative Example 1-34 | Ta | 0 | $Co_2MnGe$ | Ag | $Co_2MnGe$ | 2.9 |
| Example 1-56 | | 5 | | | | 6.5 |
| Example 1-57 | | 10 | | | | 7.6 |
| Example 1-58 | | 20 | | | | 7.8 |
| Example 1-59 | | 25 | | | | 7.5 |
| Example 1-60 | | 40 | | | | 6.8 |
| Comparative Example 1-35 | | 50 | | | | 4.3 |
| Comparative Example 1-36 | | 75 | | | | 2.9 |

TABLE 1D

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Comparative Example 1-37 | W | 0 | $Co_2MnGe$ | Ag | $Co_2MnGe$ | 2.9 |
| Example 1-61 | | 5 | | | | 6.3 |
| Example 1-62 | | 10 | | | | 7.0 |
| Example 1-63 | | 20 | | | | 7.6 |
| Example T64 | | 25 | | | | 7.4 |
| Example 1-65 | | 40 | | | | 6.6 |
| Comparative Example 1-38 | | 50 | | | | 3.6 |
| Comparative Example 1-39 | | 75 | | | | 2.8 |
| Comparative Example 1-40 | Re | 0 | $Co_2MnGe$ | Ag | $Co_2MnGe$ | 2.9 |
| Example 1-66 | | 5 | | | | 6.5 |
| Example 1-67 | | 10 | | | | 6.9 |
| Example 1-68 | | 20 | | | | 7.0 |
| Example 1-69 | | 25 | | | | 6.8 |
| Example 1-70 | | 40 | | | | 6.8 |
| Comparative Example 1-41 | | 50 | | | | 3.5 |
| Comparative Example 1-42 | | 75 | | | | 2.8 |
| Comparative Example 1-43 | Os | 0 | $Co_2MnGe$ | Ag | $Co_2MnGe$ | 2.9 |
| Example 1-71 | | 5 | | | | 6.2 |
| Example 1-72 | | 10 | | | | 6.6 |
| Example 1-73 | | 20 | | | | 6.8 |
| Example 1-74 | | 25 | | | | 6.7 |
| Example 1-75 | | 40 | | | | 6.7 |
| Comparative Example 1-44 | | 50 | | | | 3.4 |
| Comparative Example 1-45 | | 75 | | | | 2.6 |
| Comparative Example 1-46 | Ir | 0 | $Co_2MnGe$ | Ag | $Co_2MnGe$ | 2.9 |
| Example 1-76 | | 5 | | | | 5.9 |
| Example 1-77 | | 10 | | | | 7.0 |
| Example 1-78 | | 20 | | | | 6.8 |
| Example 1-79 | | 25 | | | | 6.2 |
| Example 1-80 | | 40 | | | | 5.4 |
| Comparative Example 1-47 | | 50 | | | | 2.8 |
| Comparative Example 1-48 | | 75 | | | | 2.7 |

Figure 11:
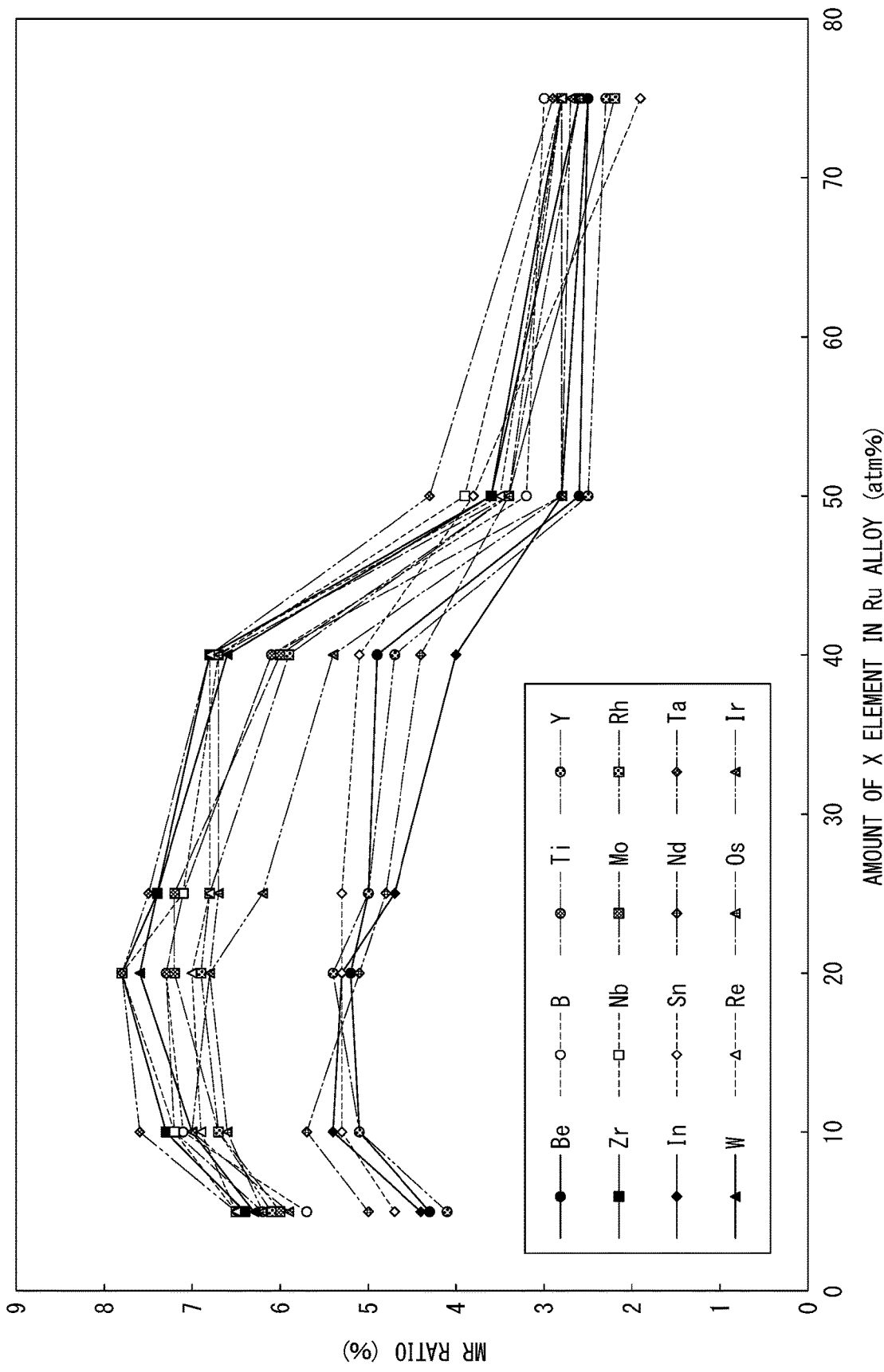
FIG. 11 is a graph showing a relationship between the amount of an X element in a Ru alloy in each of magnetoresistance effect elements produced in Examples 1-1 to 80 and Comparative Examples 1-1 to 48, and the MR ratio thereof.

From the results of Tables 1A to 1D and the graph of FIG. 11, it can be understood that, in the magnetoresistance effect elements 101 of Examples 1-1 to 1-80 in which the first ferromagnetic layer 40 and the second ferromagnetic layer 60 contain the Heusler alloys, and the Ru alloy of the first Ru alloy layer 30 contains a predetermined X element within the scope of the present disclosure, the MR ratio is improved. Although the reason why the MR ratio is improved is not always clear, it is considered that the first Ru alloy layer 30 containing the X element within the scope of the present disclosure has a hexagonal close-packed (hcp) structure and an equivalent crystal plane represented by the [0001] plane parallel to a film plane of the hcp structure is mainly oriented. That is, the reason why the MR ratio is improved is considered that, since the first Ru alloy layer 30 has an hcp structure, mutual atomic diffusion between the second underlayer 22 and the first ferromagnetic layer 40 is inhibited. Further, secondly, it is considered that, since the first Ru alloy layer 30 is mainly oriented to the equivalent crystal plane represented by the [0001] plane, its lattice match with the first ferromagnetic layer 40 formed on the first Ru alloy layer 30 is improved, and thus the crystallinity of the first ferromagnetic layer 40 (Heusler alloy) is enhanced.

Also, from the results of Tables 1A to 1D and the graph of FIG. 11, it can be understood that the MR ratio is remarkably improved in a case in which the X element is B, Ti, Zr, Nb, Mo, Rh, Ta, W, Re, Os, and Ir. The reason for this is considered that these elements have higher melting points than the metal elements contained in the Heusler alloy of the first ferromagnetic layer 40, the mutual atomic diffusion between the second underlayer 22 and the first ferromagnetic layer 40 is further inhibited.

Examples 2-1 to 55 and Comparative Examples 2-1 to 22

The magnetoresistance effect element 101 was manufactured in the same manner as in Examples 1-1 to 80, and its MR ratio was measured except that the first ferromagnetic layer 40 is a $Co_2Fe(GaGe)$ layer (having a thickness of 10 nm) and the second ferromagnetic layer 60 is a $Co_2Fe$ (GaGe) layer (having a thickness of 7 nm), and that X of the first Ru alloy layer 30 ($Ru_\alpha X_{1-\alpha}$ layer) is B, Ti, Zr, Nb, Mo, Rh, Ta, W, Re, Os, and Ir, and a is 0.95, 0.90, 0.80, 0.75, 0.60, 0.50, and 0.25. The results are shown in Tables 2A-2C below and FIG. 12.

TABLE 2A

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Example 2-1 | B | 5 | $Co_2Fe(GaGe)$ | Ag | $Co_2Fe(GaGe)$ | 8.5 |
| Example 2-2 | | 10 | | | | 9.9 |
| Example 2-3 | | 20 | | | | 10.4 |
| Example 2-4 | | 25 | | | | 10.1 |
| Example 2-5 | | 40 | | | | 9.0 |
| Comparative Example 2-1 | | 50 | | | | 6.1 |
| Comparative Example 2-2 | | 75 | | | | 6.0 |
| Example 2-6 | Ti | 5 | $Co_2Fe(GaGe)$ | Ag | $Co_2Fe(GaGe)$ | 8.4 |
| Example 2-7 | | 10 | | | | 9.7 |
| Example 2-8 | | 20 | | | | 10.5 |
| Example 2-9 | | 25 | | | | 10.0 |
| Example 2-10 | | 40 | | | | 9.2 |
| Comparative Example 2-3 | | 50 | | | | 5.8 |
| Comparative Example 2-4 | | 75 | | | | 5.8 |
| Example 2-11 | Zr | 5 | $Co_2Fe(GaGe)$ | Ag | $Co_2Fe(GaGe)$ | 9.1 |
| Example 2-12 | | 10 | | | | 10.3 |
| Example 2-13 | | 20 | | | | 11.0 |
| Example 2-14 | | 25 | | | | 10.4 |
| Example 2-15 | | 40 | | | | 9.8 |
| Comparative Example 2-5 | | 50 | | | | 6.6 |
| Comparative Example 2-6 | | 75 | | | | 5.6 |
| Example 2-16 | Nb | 5 | $Co_2Fe(GaGe)$ | Ag | $Co_2Fe(GaGe)$ | 9.5 |
| Example 2-17 | | 10 | | | | 10.2 |
| Example 2-18 | | 20 | | | | 10.8 |
| Example 2-19 | | 25 | | | | 9.8 |
| Example 2-20 | | 40 | | | | 9.5 |
| Comparative Example 2-7 | | 50 | | | | 6.7 |
| Comparative Example 2-8 | | 75 | | | | 5.4 |

TABLE 2B

| | First Ru alloy layer | | | | | |
|---|---|---|---|---|---|---|
| | Type of X element in RuX alloy | Amount of X element in RuX alloy (atm %) | First ferromagnetic layer | Non-magnetic layer | Second ferromagnetic layer | MR ratio (%) |
| Example 2-21 | Mo | 5 | $Co_2Fe(GaGe)$ | Ag | $Co_2Fe(GaGe)$ | 8.5 |
| Example 2-22 | | 10 | | | | 9.5 |
| Example 2-23 | | 20 | | | | 10.3 |
| Example 2-24 | | 25 | | | | 10.0 |
| Example 2-25 | | 40 | | | | 9.1 |
| Comparative Example 2-9 | | 50 | | | | 6.2 |
| Comparative Example 2-10 | | 75 | | | | 5.5 |
| Example 2-26 | Rh | 5 | $Co_2Fe(GaGe)$ | Ag | $Co_2Fe(GaGe)$ | 8.4 |
| Example 2-27 | | 10 | | | | 9.1 |
| Example 2-28 | | 20 | | | | 9.4 |
| Example 2-29 | | 25 | | | | 9.5 |
| Example 2-30 | | 40 | | | | 8.4 |
| Comparative Example 2-11 | | 50 | | | | 6.2 |
| Comparative Example 2-12 | | 75 | | | | 4.4 |
| Example 2-31 | Ta | 5 | $Co_2Fe(GaGe)$ | Ag | $Co_2Fe(GaGe)$ | 9.6 |
| Example 2-32 | | 10 | | | | 10.8 |
| Example 2-33 | | 20 | | | | 11.1 |
| Example 2-34 | | 25 | | | | 10.7 |
| Example 2-35 | | 40 | | | | 10.0 |
| Comparative Example 2-13 | | 50 | | | | 7.0 |
| Comparative Example 2-14 | | 75 | | | | 6.0 |

TABLE 2B-continued

|  | First Ru alloy layer | | First ferromagnetic layer | Non-magnetic layer | Second ferromagnetic layer | MR ratio (%) |
|---|---|---|---|---|---|---|
|  | Type of X element in RuX alloy | Amount of X element in RuX alloy (atm %) |  |  |  |  |
| Example 2-36 | W | 5 | $Co_2Fe(GaGe)$ | Ag | $Co_2Fe(GaGe)$ | 9.4 |
| Example 2-37 |  | 10 |  |  |  | 10.3 |
| Example 2-38 |  | 20 |  |  |  | 10.8 |
| Example 2-39 |  | 25 |  |  |  | 10.0 |
| Example 2-40 |  | 40 |  |  |  | 9.3 |
| Comparative Example 2-15 |  | 50 |  |  |  | 6.2 |
| Comparative Example 2-16 |  | 75 |  |  |  | 5.5 |

TABLE 2C

|  | First Ru alloy layer | | First ferromagnetic layer | Non-magnetic layer | Second ferromagnetic layer | MR ratio (%) |
|---|---|---|---|---|---|---|
|  | Type of X element in RuX alloy | Amount of X element in RuX alloy (atm %) |  |  |  |  |
| Example 2-41 | Re | 5 | $Co_2Fe(GaGe)$ | Ag | $Co_2Fe(GaGe)$ | 9.1 |
| Example 2-42 |  | 10 |  |  |  | 9.6 |
| Example 2-43 |  | 20 |  |  |  | 9.7 |
| Example 2-44 |  | 25 |  |  |  | 9.6 |
| Example 2-45 |  | 40 |  |  |  | 9.6 |
| Comparative Example 2-17 |  | 50 |  |  |  | 6.2 |
| Comparative Example 2-18 |  | 75 |  |  |  | 5.5 |
| Example 2-46 | Os | 5 | $Co_2Fe(GaGe)$ | Ag | $Co_2Fe(GaGe)$ | 8.8 |
| Example 2-47 |  | 10 |  |  |  | 9.7 |
| Example 2-48 |  | 20 |  |  |  | 9.9 |
| Example 2-49 |  | 25 |  |  |  | 9.8 |
| Example 2-50 |  | 40 |  |  |  | 9.7 |
| Comparative Example 2-19 |  | 50 |  |  |  | 6.2 |
| Comparative Example 2-20 |  | 75 |  |  |  | 5.3 |
| Example 2-51 | Ir | 5 | $Co_2Fe(GaGe)$ | Ag | $Co_2Fe(GaGe)$ | 8.4 |
| Example 2-52 |  | 10 |  |  |  | 9.2 |
| Example 2-53 |  | 20 |  |  |  | 9.3 |
| Example 2-54 |  | 25 |  |  |  | 9.2 |
| Example 2-55 |  | 40 |  |  |  | 8.2 |
| Comparative Example 2-21 |  | 50 |  |  |  | 5.5 |
| Comparative Example 2-22 |  | 75 |  |  |  | 5.1 |

Figure 12:
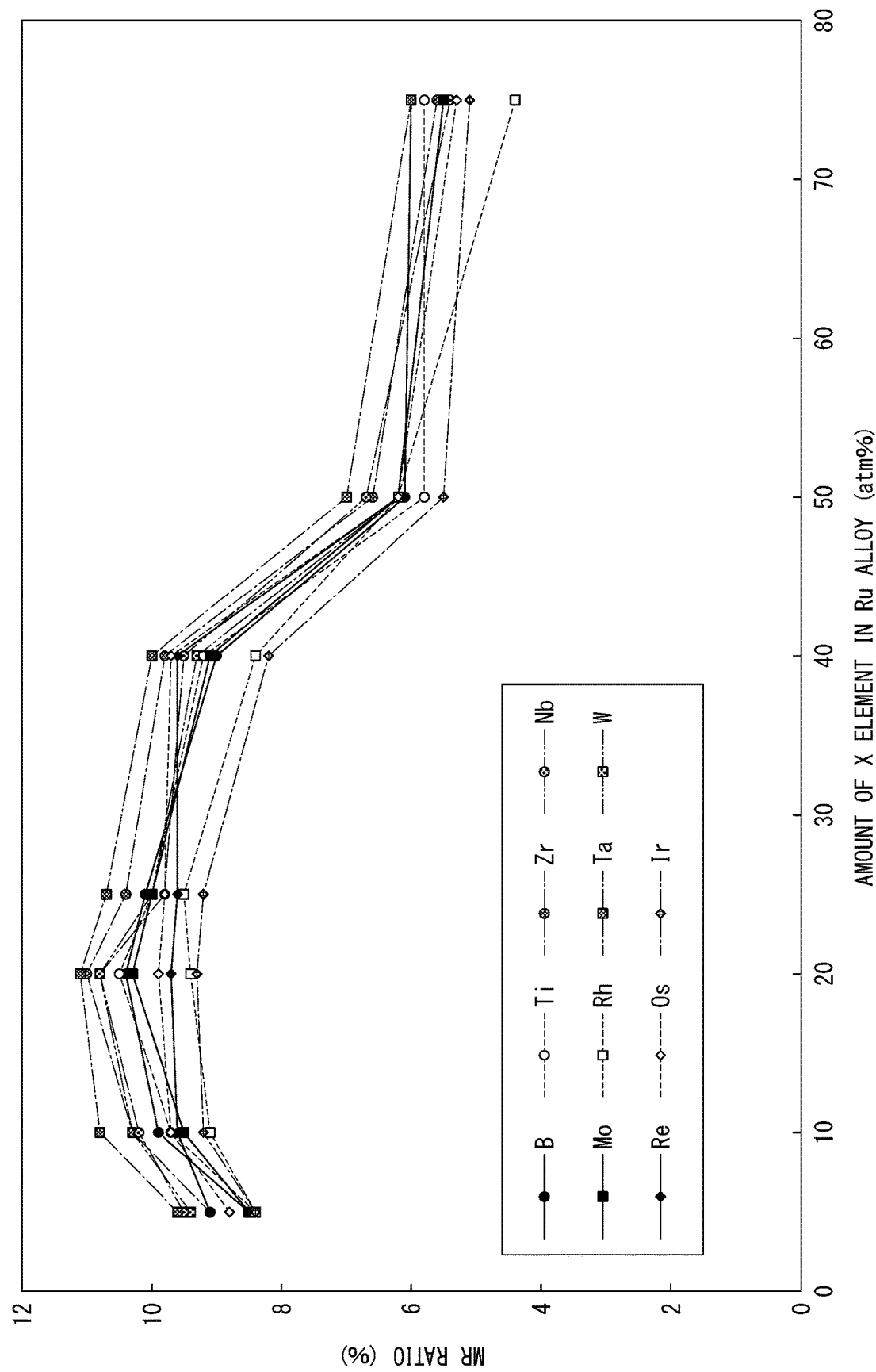
FIG. 12 is a graph showing a relationship between the amount of an X element in a Ru alloy in each of magnetoresistance effect elements produced in Examples 2-1 to 55 and Comparative Examples 2-1 to 22, and the MR ratio thereof.

From the results in Tables 2A to 2C and the graph of FIG. 12, it was confirmed that, even in a case in which the Heusler alloy contained in the first ferromagnetic layer 40 and the second ferromagnetic layer 60 is $Co_2Fe(GaGe)$, the MR ratio is improved in the magnetoresistance effect element 101 of Examples 2-1 to 2-55 in which the first Ru alloy layer 30 contains a predetermined X element within the scope of the present disclosure. Also, it was confirmed that the MR ratio is improved in a case in which the Heusler alloy contained in the first ferromagnetic layer 40 and the second ferromagnetic layer 60 is $Co_2Fe(GaGe)$ as compared with a case in which the Heusler alloy contained in the first ferromagnetic layer 40 and the second ferromagnetic layer 60 is $Co_2MnGe$. The reason why this MR ratio is improved is considered that a Co-based Heusler alloy containing Fe has a relatively high melting point, and thus the atomic mutual diffusion between the second underlayer 22 and the first ferromagnetic layer 40 is further inhibited.

Examples 3-1 to 11

The magnetoresistance effect element 102 was manufactured in the same manner as in Examples 1-8, 13, 23, 28, 33, 38, 58, 63, 68, 73, and 78, except that the first CoFeB layer 91 (having a thickness of 1 nm) was provided between the first Ru alloy layer 30 and the first ferromagnetic layer 40, and its MR ratio was measured. The first CoFeB layer 91 was formed using a sputtering method. The results are shown in Table 3 below.

TABLE 3

| | First Ru alloy layer | | | | | | |
|---|---|---|---|---|---|---|---|
| | Type of X element in RuX alloy | Amount of X element in RuX alloy (atm %) | First CoFeB layer | First ferromagnetic layer | Non-magnetic layer | Second ferromagnetic layer | MR ratio (%) |
| Example 3-1 | B | 20 | Presence | Co$_2$MnGe | Ag | Co$_2$MnGe | 12.6 |
| Example 3-2 | Ti | 20 | Presence | | | | 12.5 |
| Example 3-3 | Zr | 20 | Presence | | | | 13.1 |
| Example 3-4 | Nb | 20 | Presence | | | | 12.6 |
| Example 3-5 | Mo | 20 | Presence | | | | 12.0 |
| Example 3-6 | Rh | 20 | Presence | | | | 11.1 |
| Example 3-7 | Ta | 20 | Presence | | | | 13.6 |
| Example 3-8 | W | 20 | Presence | | | | 13.1 |
| Example 3-9 | Re | 20 | Presence | | | | 12.0 |
| Example 3-10 | Os | 20 | Presence | | | | 11.7 |
| Example 3-11 | Ir | 20 | Presence | | | | 10.9 |

From the results in Table 3, it was confirmed that, by providing the first CoFeB layer 91 between the first Ru alloy layer 30 and the first ferromagnetic layer 40, the MR ratio is improved. The reason why this MR ratio is improved is considered that, by interposing the first CoFeB layer 91 between the first Ru alloy layer 30 and the first ferromagnetic layer 40, atomic mutual diffusion between the first Ru alloy layer 30 and the first ferromagnetic layer 40 is inhibited.

Examples 4-1 to 11

The magnetoresistance effect element 103 was manufactured in the same manner as in Examples 3-1 to 11 except that the second Ru alloy layer 70 (having a thickness of 3 nm) was provided on the side of the second ferromagnetic layer 60 (cap layer 80 side) opposite to the non-magnetic metal layer 50 side, and that the second CoFeB layer 92 (having a thickness of 1 nm) was disposed between the second Ru alloy layer 70 and the second ferromagnetic layer 60, and its MR ratio was measured. The second Ru alloy layer 70 was formed in the same manner as the first Ru alloy layer 30, and the second CoFeB layer 92 was formed in the same manner as the first CoFeB layer 91. The results are shown in Table 4 below.

From the results in Table 4, it was confirmed that the MR ratio is improved by providing the second Ru alloy layer 70 and disposing the second CoFeB layer 92 between the second Ru alloy layer 70 and the second ferromagnetic layer 60. The reason why this MR ratio is improved is considered that, by providing the second Ru alloy layer 70, mutual atomic diffusion between the second ferromagnetic layer 60 and the cap layer 80 is inhibited, and by interposing the second CoFeB layer 92 between the second ferromagnetic layer 60 and the second Ru alloy layer 70, the mutual atomic diffusion between the second ferromagnetic layer 60 and the second Ru alloy layer 70 is inhibited.

Examples 5-1 to 11

The magnetoresistance effect element 104 was manufactured in the same manner as in Examples 1-8, 13, 23, 28, 33, 38, 58, 63, 68, 73, and 78 except that the first Ru alloy layer 30 is a laminate having a two-layered structure in which compositions differ in the laminating direction, the element content of the lower first Ru alloy layer 31 (having a thickness of 3 nm) is 10 atm %, and the element content of the upper first Ru alloy layer 32 (having a thickness of 2 nm) is set to 30 atm %, and its MR ratio was measured. The results are shown in Table 5 below.

TABLE 4

| | First Ru alloy layer | | | | | | | Second Ru alloy layer | | |
|---|---|---|---|---|---|---|---|---|---|---|
| | Type of X element in RuX alloy | Amount of X element in RuX alloy (atm%) | First layer CoFeB | First layer ferromagnetic | Non-layer magnetic | Second layer ferromagnetic | Second layer CoFeB | Type of X element in RuX alloy | Amount of X element in RuX alloy (atm%) | MR ratio (%) |
| Example 4-1 | B | 20 | Presence | Co$_2$MnGe | Ag | Co$_2$MnGe | Presence | B | 20 | 17.8 |
| Example 4-2 | Ti | 20 | Presence | | | | Presence | Ti | 20 | 17.6 |
| Example 4-3 | Zr | 20 | Presence | | | | Presence | Zr | 20 | 18.5 |
| Example 4-4 | Nb | 20 | Presence | | | | Presence | Nb | 20 | 18.0 |
| Example 4-5 | Mo | 20 | Presence | | | | Presence | Mo | 20 | 17.2 |
| Example 4-6 | Rh | 20 | Presence | | | | Presence | Rh | 20 | 16.2 |
| Example 4-7 | Ta | 20 | Presence | | | | Presence | Ta | 20 | 19.0 |
| Example 4-8 | W | 20 | Presence | | | | Presence | W | 20 | 18.5 |
| Example 4-9 | Re | 20 | Presence | | | | Presence | Re | 20 | 17.3 |
| Example 4-10 | Os | 20 | Presence | | | | Presence | Os | 20 | 17.1 |
| Example 4-11 | Ir | 20 | Presence | | | | Presence | Ir | 20 | 16.1 |

TABLE 5

| | Type of X | First Ru alloy layer | | First ferromagnetic layer | Non-magnetic layer | Second ferromagnetic layer | MR ratio (%) |
| | | Amount of X element in RuX alloy (atm %) | | | | | |
| | RuX alloy element in | Lower first Ru alloy layer | Upper first Ru alloy layer | | | | |
|---|---|---|---|---|---|---|---|
| Example 5-1 | B | 10 | 30 | Co₂MnGe | Ag | Co₂MnGe | 13.6 |
| Example 5-2 | Ti | 10 | 30 | | | | 13.4 |
| Example 5-3 | Zr | 10 | 30 | | | | 14.1 |
| Example 5-4 | Nb | 10 | 30 | | | | 13.5 |
| Example 5-5 | Mo | 10 | 30 | | | | 13.7 |
| Example 5-6 | Rh | 10 | 30 | | | | 12.8 |
| Example 5-7 | Ta | 10 | 30 | | | | 14.3 |
| Example 5-8 | W | 10 | 30 | | | | 14.0 |
| Example 5-9 | Re | 10 | 30 | | | | 12.6 |
| Example 5-10 | Os | 10 | 30 | | | | 12.8 |
| Example 5-11 | Ir | 10 | 30 | | | | 12.1 |

From the results in Table 5, it was confirmed that the MR ratio is improved by increasing the amount of the X element in the upper first Ru alloy layer 32 on the first ferromagnetic layer 40 side. The reason why this MR ratio is improved is considered that, by increasing the amount of the X element in the upper first Ru alloy layer 32, the lattice mismatch between the first Ru alloy layer 30 and the first ferromagnetic layer 40 decreases.

Examples 6-1 to 11

The magnetoresistance effect element 105 was manufactured in the same manner as in Examples 4-1 to 11 except that the first Ru alloy layer 30 is a laminate having a two-layered structure in which compositions differ in the laminating direction, the element amount of the lower first Ru alloy layer 31 (thickness 3 nm) was set to 10 atm %, and the element amount of the upper first Ru alloy layer 32 (thickness 2 nm) was set to 30 atm %, and that the second Ru alloy layer 70 is a laminate having a two-layered structure in which compositions differ in the laminating direction, the element content of the lower second Ru alloy layer 71 (having a thickness of 2 nm) was set to 30 atm %, and the element content of the upper second Ru alloy layer 72 (having a thickness of 3 nm) was set to 10 atm %, and its MR ratio was measured. The results are shown in Table 6 below.

TABLE 6

| | First Ru alloy layer | | | | | | | | Second Ru alloy layer | | | |
| | | Amount of X element in RuX alloy (atm %) | | | | | | | | Amount of X element in RuX alloy (atm %) | | |
| | Type of X element in RuX alloy | Lower-first Ru alloy layer | Upper-first Ru alloy layer | First CoFeB layer | First ferromagnetic layer | Non-magnetic layer | Second ferromagnetic layer | Second CoFeB layer | Type of X element in RuX alloy | Lower second Ru alloy layer | Upper-second Ru alloy layer | MR (%) ratio |
|---|---|---|---|---|---|---|---|---|---|---|---|---|
| Example 6-1 | B | 10 | 30 | Presence | CoMnGe | Ag | CoMnGe | Presence | B | 30 | 10 | 24.0 |
| Example 6-2 | Ti | 10 | 30 | Presence | | | | Presence | Ti | 30 | 10 | 23.6 |
| Example 6-3 | Zr | 10 | 30 | Presence | | | | Presence | Zr | 30 | 10 | 24.8 |
| Example 6-4 | Nb | 10 | 30 | Presence | | | | Presence | Nb | 30 | 10 | 24.3 |
| Example 6-5 | Mo | 10 | 30 | Presence | | | | Presence | Mo | 30 | 10 | 23.6 |
| Example 6-6 | Rh | 10 | 30 | Presence | | | | Presence | Rh | 30 | 10 | 22.0 |
| Example 6-7 | Ta | 10 | 30 | Presence | | | | Presence | Ta | 30 | 10 | 24.6 |
| Example 6-8 | W | 10 | 30 | Presence | | | | Presence | W | 30 | 10 | 24.3 |
| Example 6-9 | Re | 10 | 30 | Presence | | | | Presence | Re | 30 | 10 | 23.1 |
| Example 6-10 | Os | 10 | 30 | Presence | | | | Presence | Os | 30 | 10 | 22.7 |
| Example 6-11 | Ir | 10 | 30 | Presence | | | | Presence | Ir | 30 | 10 | 21.8 |

From the results in Table 6, it was confirmed that the first CoFeB layer 91 is disposed between the first Ru alloy layer 30 and the first ferromagnetic layer 40, the second Ru alloy layer 70 is provided, the second CoFeB layer 92 is disposed between the second Ru alloy layer 70 and the second ferromagnetic layer 60, the first Ru alloy layer 30 increases the amount of the X element in the upper first Ru alloy layer 32 on the first ferromagnetic layer 40 side, and the second Ru alloy layer 70 increases the amount of the X element in the lower second Ru alloy layer 71 on the second ferromagnetic layer 60 side, and thus the MR ratio is further improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

10 Substrate
20 Underlayer
21 First underlayer
22 Second underlayer
30 First Ru alloy layer
31 Lower first Ru alloy layer
32 Upper first Ru alloy layer
40 First ferromagnetic layer
50 Non-magnetic metal layer
60 Second ferromagnetic layer
70 Second Ru alloy layer
71 Lower second Ru alloy layer
72 Upper second Ru alloy layer
80 Cap layer
91 First CoFeB layer
92 Second CoFeB layer
101, 102, 103, 104, 105 Magnetoresistance effect element
201, 202, 203 Magnetic recording element
204 Domain wall motion element
205 High-frequency device
220 Resistance measuring instrument
230 Power supply
240 Measuring unit
251 First magnetization pinned layer
252 Second magnetization pinned layer
260 Direct current power supply
261 Inductor
262 Capacitor
263 Output port
264 Wiring
265 Wiring

What is claimed is:

1. A magnetoresistance effect element comprising a first Ru alloy layer, a first ferromagnetic layer, a non-magnetic metal layer, and a second ferromagnetic layer in order,
wherein the first Ru alloy layer contains one or more Ru alloys represented by the following general formula (1), $$Ru_\alpha X_{1-\alpha} \quad (1)$$

where, in the general formula (1), the symbol X represents one or more elements selected from the group consisting of Be, B, Ti, Y, Zr, Nb, Mo, Rh, In, Sn, La, Ce, Nd, Sm, Gd, Dy, Er, Ta, W, Re, Os, and Ir, and the symbol $\alpha$ represents a number satisfying $0.5<\alpha<1$,
the first ferromagnetic layer contains a Heusler alloy, and the second ferromagnetic layer contains a Heusler alloy.

2. The magnetoresistance effect element according to claim 1, wherein the symbol X in the general formula (1) represents one or more elements selected from the group consisting of B, Ti, Zr, Nb, Mo, Rh, Ta, W, Re, Os, and Ir.

3. The magnetoresistance effect element according to claim 1, wherein a Ru content of the Ru alloy contained in the first Ru alloy layer changes in an in-plane direction or a laminating direction of the first Ru alloy layer.

4. The magnetoresistance effect element according to claim 1, wherein a Ru content of the Ru alloy contained in the first Ru alloy layer continuously changes in the laminating direction of the first Ru alloy layer.

5. The magnetoresistance effect element according to claim 1, wherein a Ru content of the Ru alloy contained in the first Ru alloy layer increases from a surface of the first Ru alloy layer on the first ferromagnetic layer side toward a surface of the first Ru alloy layer on a side opposite to the first ferromagnetic layer side.

6. The magnetoresistance effect element according to claim 1, wherein at least one of the Heusler alloy contained in the first ferromagnetic layer and the Heusler alloy contained in the second ferromagnetic layer contains one or more Heusler alloys represented by the following general formula (2), $$Co_2(Fe_{1-\beta}, M1_\beta)M2 \quad (2)$$

where, in the general formula (2), the symbol M1 represents Mn or Ti, the symbol M2 represents one or more elements selected from the group consisting of Si, Al, Ga, Ge, and Sn, and the symbol $\beta$ represents a number satisfying $0 \leq \beta \leq 1$.

7. The magnetoresistance effect element according to claim 6, wherein the Heusler alloy is one or more alloys selected from the group consisting of $Co_2Fe(GaGe)$, $Co_2(MnFe)Ge$, and $Co_2(FeMn)(GaGe)$.

8. The magnetoresistance effect element according to claim 6, wherein the first ferromagnetic layer contains the Heusler alloy represented by the general formula (2), and the Heusler alloy contained in a surface of the first ferromagnetic layer on the first Ru alloy layer side has a large amount of Co and Fe as compared with the Heusler alloy contained in a surface thereof on a side opposite to the first Ru alloy layer side.

9. The magnetoresistance effect element according to claim 6, wherein the second ferromagnetic layer contains the Heusler alloy represented by the general formula (2), and the Heusler alloy contained in an interface of the second ferromagnetic layer on a side opposite to the non-magnetic metal layer side has a large amount of Co and Fe as compared with the Heusler alloy contained in an interface of the second ferromagnetic layer on the non-magnetic metal layer side.

10. The magnetoresistance effect element according to claim 1, wherein a CoFeB layer or a CoFe layer is provided between the first ferromagnetic layer and the first Ru alloy layer.

11. The magnetoresistance effect element according to claim 1, wherein a second Ru alloy layer is provided on a surface of the second ferromagnetic layer on a side opposite to the non-magnetic metal layer, and the second Ru alloy layer contains one or more Ru alloys represented by the general formula (1).

12. The magnetoresistance effect element according to claim 11, wherein a CoFeB layer or a CoFe layer is provided between the second ferromagnetic layer and the second Ru alloy layer.

13. The magnetoresistance effect element according to claim 1, wherein the non-magnetic metal layer contains Ag or a Ag alloy.

* * * * *